US011714142B2

(12) United States Patent
Phung et al.

(10) Patent No.: US 11,714,142 B2
(45) Date of Patent: Aug. 1, 2023

(54) FLUX LINE FILTER

(71) Applicant: International Business Machines Corporation, Armonk, NY (US)

(72) Inventors: Timothy Phung, Milpitas, CA (US); Jiri Stehlik, New York, NY (US); Devin Underwood, Bronx, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 229 days.

(21) Appl. No.: 17/119,519

(22) Filed: Dec. 11, 2020

(65) Prior Publication Data
US 2022/0187388 A1 Jun. 16, 2022

(51) Int. Cl.
*G01R 33/58* (2006.01)
*G01R 33/035* (2006.01)
(Continued)

(52) U.S. Cl.
CPC .......... *G01R 33/0358* (2013.01); *H01P 1/047* (2013.01); *H03H 7/0138* (2013.01); *H03H 7/0153* (2013.01)

(58) Field of Classification Search
CPC ... G01V 3/38; G01V 3/04; G01V 3/10; G01V 3/12; G01V 3/101; G01V 3/102;
(Continued)

(56) References Cited

U.S. PATENT DOCUMENTS 5,611,008 A 3/1997 Yap
6,678,540 B2 1/2004 Wire et al.
(Continued)

FOREIGN PATENT DOCUMENTS

JP 2008-118592 A 5/2008
WO 2019117949 6/2019

OTHER PUBLICATIONS

International Search Report and Written Opinion received for PCT Application Serial No. PCT/EP2021/084862 dated Mar. 23, 2022, 16 pages.
(Continued)

*Primary Examiner* — Jermele M Hollington
*Assistant Examiner* — Taqi R Nasir
(74) *Attorney, Agent, or Firm* — Amin, Turocy & Watson, LLP

(57) ABSTRACT

Techniques for creating a low pass filter associated with a flux line are presented. A qubit device can comprise a first substrate and second substrate. A low pass filter, comprising at least one inductor and at least one capacitor can be formed, wherein respective components of or associated with the low pass filter can be formed on the first or second substrates, and wherein one or more bump bonds can extend between the substrates to connect respective components that are on respective substrates. The filter can receive an input signal via an input line and filter the signal to produce a filtered signal as output to a flux line that is in proximity to a coupler with SQUID loop and one or more flux-tunable qubits that are formed on one of the substrates. The filter can reduce electrical noise and Purcell decay associated with the flux line.

20 Claims, 17 Drawing Sheets

(51) Int. Cl.
*H01P 1/04* (2006.01)
*H03H 7/01* (2006.01)

(58) Field of Classification Search
CPC ........ G01V 3/104; G01V 3/105; G01V 3/107; G01V 3/108; G01V 3/165; G01N 27/72; G01N 27/80; G01N 27/82; G01N 27/83; G01N 27/90; G01N 27/9006; G01N 27/9013; G01N 27/902; G01N 27/9046; G01R 23/06; G01R 33/0358; H01P 1/047; H03H 7/0138; H03H 7/0153
See application file for complete search history.

(56) References Cited

U.S. PATENT DOCUMENTS

| | | | |
|---|---|---|---|
| 9,059,674 B2* | 6/2015 | Chow | H10N 60/00 |
| 9,893,262 B2 | 2/2018 | Thompson et al. | |
| 10,242,968 B2 | 3/2019 | Das et al. | |
| 10,651,361 B2 | 5/2020 | Brink et al. | |
| 2010/0090781 A1* | 4/2010 | Yamamoto | H01L 27/016 333/167 |
| 2019/0044668 A1* | 2/2019 | Elsherbini | G06N 10/00 |

OTHER PUBLICATIONS

Zverev A.I., "Filter Characteristics in the Frequency Domain", Handbook of Filter Synthesis, John Wiley and Sons, Inc., New York, XP055900079, Jan. 1, 1967, 586 pages.
Reed, "Entanglement and Quantum Error Correction with Superconducting Qubits," arXiv:1311.6759v1 [quant-ph] Nov. 26, 2013; 368 pages.
Mi et al., "Circuit Quantum Electrodynamics Architecture for Gate-Defined Quantum Dots in Silicon," arXiv:1610.05571v2 [cond-mat.mes-hall] Feb. 9, 2017; 4 pages.
Reed et al., "Fast Reset and Suppressing Spontaneous Emission of a Superconducting Qubit," arXiv:1003.0142v2 [cond-mat.mes-hall] May 31, 2010; 4 pages.
Jeffrey et al., "Fast Accurate State Measurement with Superconducting Qubits," Phys. Rev. Lett. 112, 190504—Published May 16, 2014; 5 pages.
Kwak et al., "High temperature superconducting low pass filter for suppressed harmonics," Physica C Superconductivity 372:532-535; Aug. 2002; 4 pages.
Kwak et al., "Design of High-Temperature Superconducting Low-Pass Filter for Broad-Band Harmonic Rejection," IEEE Transactions on Applied Superconductivity, Jun. 2001, vol. 11, No. 2, pp. 4023-4026.

* cited by examiner

FLUX LINE FILTER

BACKGROUND

The subject disclosure relates to quantum circuitry, and more specifically, to a flux line filter.

SUMMARY

The following presents a summary to provide a basic understanding of one or more embodiments of the disclosed subject matter. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, devices, structures, methods, apparatuses, and/or computer program products that can facilitate creating, designing, and/or utilizing a filter (e.g., low pass filter) for a flux line of a flux-tunable qubit device are presented.

According to an embodiment, a system can comprise a filter component. The filter component can comprise an inductor component situated on a first substrate component. The filter component also can comprise a capacitor component situated on a second substrate component and associated with the inductor component via a bump bond that extends from the first substrate component to the second substrate component.

Another embodiment relates to a method that can comprise forming an inductor on a first substrate. The method also can comprise forming a capacitor on a second substrate, wherein the capacitor is associated with the inductor via a bump bond that spans from the first substrate to the second substrate to facilitate forming a filter.

A further embodiment relates to a system that can comprise a filter component. The filter component can comprise an inductor component formed on a first substrate component. The filter component also can comprise a capacitor component formed on the first substrate component and associated with the inductor component, wherein the inductor component is associated with a second substrate component via a bump bond that extends from the first substrate component to the second substrate component to facilitate associating the inductor component with a flux line component that is formed on the second substrate component.

These and other features will become apparent from the following detailed description of illustrative embodiments thereof, which is to be read in connection with the accompanying drawings.

DETAILED DESCRIPTION

Figure 1:
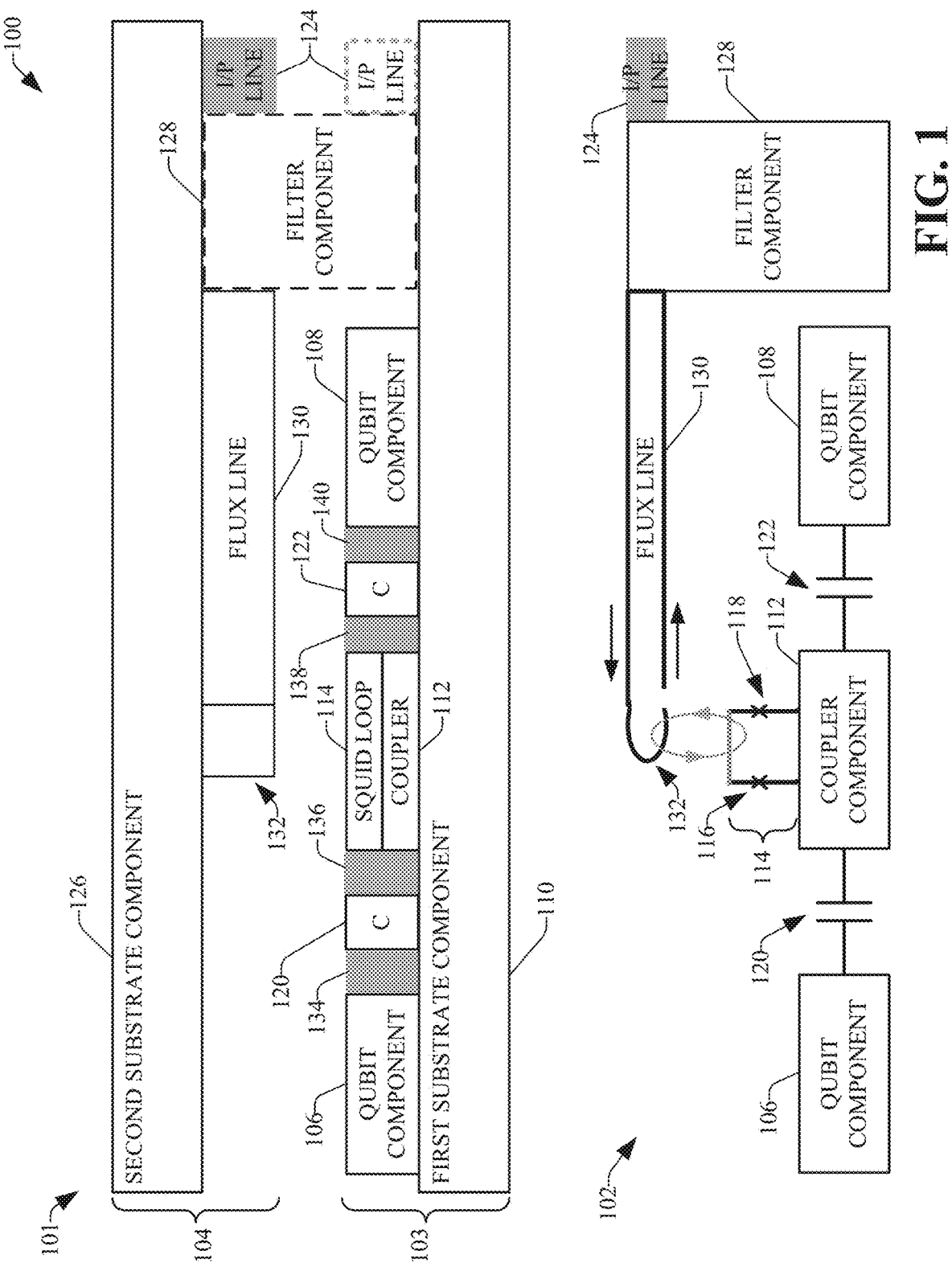
FIG. 1 illustrates a diagram of an example, non-limiting device that can comprise a filter component to facilitate desirably filtering an input signal to provide a desirable filtered signal and reduce Purcell loss of the coupler and qubit devices, in accordance with various aspects and embodiments of the disclosed subject matter.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Frequency tunable qubit devices can be useful and desirable in many quantum computing architectures. Frequency tunable qubit devices can be used for multi-qubit gate operations as a tunable coupling device, for example.

There can be frequency tunable devices based on superconducting quantum interference devices (SQUIDs) that can be tuned using a magnetic field or flux. It can be desirable for flux-tunable qubit device architectures to have placement of a flux line in close proximity to the qubit and coupler devices. Undesirable noise can couple into the flux line from dissipative off-chip environments and can be a source of undesirable Purcell loss for the qubit devices. Electrical noise can also degrade qubit/coupler performance, for instance, by suppressing the lifetime and dephasing of the qubit/coupler device, which can in turn undesirably limit the achievable gate fidelity for multi-qubit devices. It also can be desirable that the signals applied to the flux line not be distorted.

As a result, it can be desirable to have frequency tunable devices that do not suffer from these and/or other deficiencies. For instance, it can be desirable to create, realize, or develop a desirably designed flux-tunable qubit device that can have improved (e.g., higher or enhanced) performance, can have reduced electric noise in the flux line, and can have reduced Purcell loss.

To that end, the various embodiments described herein relate to techniques for designing, creating, and/or utilizing a filter (e.g., low pass filter) that can be associated with a flux line of a flux-tunable qubit device. In some embodiments, a qubit device can comprise a first substrate component and a second substrate component. A filter component (e.g., low pass filter component), which can comprise a set of inductor components, comprising at least one inductor component, and a set of capacitor components, comprising at least one capacitor component, can be formed, wherein respective components (e.g., respective inductor component(s) and capacitor component(s)) of or associated with the filter component can be formed on the first substrate component or second substrate component, and wherein one or more bump bond components can extend between the substrate components to connect respective components that are on the respective substrate components.

For example, the filter component can be structured to comprise a capacitor component that can be formed on the first substrate component (e.g., on a qubit chip) and an inductor component that can be formed on the second substrate component (e.g., on an interposer chip), wherein a bump bond component can be formed to extend from the first substrate component to the second substrate component to facilitate connecting the capacitor component to the inductor component and forming the filter. As another example, the filter component can be structured to comprise a capacitor component and an inductor component that can be formed on the first substrate component, wherein the capacitor component and the inductor component can be associated with (e.g., connected to) each other to facilitate forming the filter. A bump bond component can be formed to extend from the first substrate component (e.g., from the inductor component on the first substrate component) to the second substrate component (e.g., to a pad component on the second substrate component) to facilitate connecting the inductor component to the second substrate component, which can be associated with a flux line component.

The filter component (e.g., the inductor component and/or the pad component of the filter component) can be associated with (e.g., connected to) a flux line component that can be in desirably close proximity to a SQUID loop of a coupler component (e.g., qubit/coupler component) associated with one or more qubit components (e.g., flux-tunable qubit components), wherein the one or more qubit components and the coupler component can be formed on the first substrate component. The filter component can receive an input signal (e.g., input electrical signal) via an input line component and can filter (e.g., low pass filter) the input signal to produce a filtered signal as output that can be applied to the flux line component. In response to the filtered signal, the flux line component can produce a desirable magnetic field/flux that can be applied to the SQUID loop, which can be in desirably close proximity to the flux line component, to facilitate desirably tuning a frequency of the qubit device (e.g., of the one or more qubit components of the qubit device). The filter component can desirably mitigate (e.g., reduce or minimize) electrical noise and Purcell decay that would otherwise be associated with applying a raw (e.g., unprocessed) input signal (e.g., electrical signal) to the flux line and can enhance performance and efficiency of the qubit device, such as more fully described herein.

In some embodiments, the filter component can comprise a ladder network, comprising a set of inductor components and a set of capacitor components, to realize higher order filters by cascading multiple stages (e.g., LC stages) of inductor components and capacitor components. By adding additional LC stages to the filter component, the filter component can have higher order filters that can have more stop band attenuation than a single stage LC filter. The inductor components of the set of inductor components can be formed on the second substrate component (e.g., on the interposer chip), and capacitor components of the set of capacitor components can be formed on the first substrate component (e.g., on the qubit chip) or the second substrate component (e.g., in an alternating manner), as more fully described herein. Bump bond components can connect the inductor components on the second substrate component to the first substrate component (e.g., pad components on the first substrate component) to facilitate connecting respective inductor components to respective capacitor components and forming the ladder network.

These and other aspects and embodiments of the disclosed subject matter will now be described with respect to the drawings.

FIG. 1 illustrates a diagram of two perspectives of an example, non-limiting device 100 that can comprise a filter component to facilitate desirably filtering an input signal to provide a desirable (e.g., enhanced, suitable, acceptable, or optimal) filtered signal and reduce Purcell loss of a coupler and qubit devices, in accordance with various aspects and embodiments of the disclosed subject matter. FIG. 1 illustrates a first perspective 101 that is a side cross-sectional view of the device 100, and a second perspective 102 that is a block diagram of various components of the device 100. The device 100 can comprise a system of various components and circuitry that can be arranged to perform one or more desired functions. In some embodiments, the device 100 can be or can comprise a qubit device (e.g., a frequency tunable qubit device). The device 100 can be a transmon qubit device, for example.

The device 100 can comprise a first chip 103 (e.g., qubit chip) and a second chip 104 (e.g., interposer chip). In some embodiments, the first chip 103 and the second chip 104 can be arranged in relation to each other to form a flip-chip package, wherein the second chip 104 can be flipped over (e.g., turned over) such that its top surface, with various components and circuitry formed thereon, can be facing, and in relatively close proximity to, the top surface of the first chip 103, on which various other components and circuitry can be formed. A set of qubit components, including qubit component 106 and qubit component 108, can be situated or formed on a first substrate component 110 of the first chip 103. The first chip 103 also can comprise a coupler component (COUPLER) 112 (e.g., qubit/coupler component), which can include a SQUID loop 114, that can be situated or formed on the first substrate component 110. The SQUID loop 114 can comprise a set of Josephson junctions, including Josephson junction 116 and Josephson junction 118, that can facilitate performing the function of the SQUID loop 114, such as described herein.

The first chip 103 further can comprise capacitor components (C), including capacitor component 120 and capacitor component 122, that can be formed on the first substrate component 110. The capacitor component 120 can be situated between the qubit component 106 and the coupler component 112 in part to electrically connect the qubit component 106 to the coupler component 112. The capacitor component 122 can be situated between the qubit component 108 and the coupler component 112 in part to electrically connect the qubit component 108 to the coupler component 112.

It can be desirable to tune (e.g., adjust or modify) a frequency of the device 100. In some embodiments, a magnetic flux can be applied to the SQUID loop 114 to facilitate tuning the frequency of the device 100 (e.g., the qubit components 106 and 108 of the device 100), wherein the adjustment or tuning of the frequency of the device 100 can be based at least in part on the amount of magnetic flux that is applied to the SQUID loop 114. The device 100 can comprise an input line component (UP LINE) 124 that can receive an input signal (e.g., electrical or current signal) that can be intended to facilitate producing a magnetic flux that can be applied to the SQUID loop 114. In some embodiments, the input line component 124 can be formed on a second substrate component 126 of the second chip 104 (as depicted in FIG. 1). In other embodiments, the input line component 124 can be formed on the first substrate component 110 of the first chip 103. In some embodiments, the input line component 124 can be a can be a coplanar waveguide transmission line with a 50 ohm characteristic impedance.

It typically can be desirable to have a flux line in relatively close proximity to the qubit components (e.g., 106, 108) and coupler component 112 to facilitate tuning of the frequency of the device 100. Traditionally, the flux line can be part of the input line and can receive the raw (e.g., unprocessed) input signal. However, the input signal being transmitted by the input line component 124 can contain undesirable noise (e.g., electrical noise) that can undesirably couple into the flux line from dissipative off-chip environments, and, in addition to the noise, this also can be a source of undesirable Purcell loss for the qubit components, if the flux line receives the raw input signal. This can negatively impact the tuning of the device 100 (e.g., the qubit components 106 and 108 of the device 100) and the performance of the device 100 (e.g., the performance of the device 100 at the frequencies of interest of the qubit components 106 and 108, and the coupler component 112).

To facilitate mitigating (e.g., reducing or minimizing) undesirable noise associated with the input signal and mitigating undesirable Purcell decay, in accordance with various embodiments, the device 100 can comprise a filter component 128 (e.g., low pass filter component) that can be associated with (e.g., electrically connected to) the input line component 124 at the input of the filter component 128 and associated with a flux line component (FLUX LINE) 130 at an output of the filter component 128. The flux line component 130 can comprise a flux coupler component 132 at the extended end of the flux line component 130. In accordance with various embodiments, the flux line portion of the flux line component 130 between the filter component 128 and the flux coupler component 132 can have (e.g., can extend out) a desired length, which can be 1 millimeter (mm), 2 mm, or more or less than 2 mm. The flux line component 130, including the flux line portion, can be desirably non-dissipative (e.g., not a 50 ohm line), and can be extended for routing, if and as desired, to satisfy design constraints or otherwise enhance performance of the device 100.

The filter component 128 can receive the input signal from the input line component 124, and can desirably filter (e.g., low pass filter) the input signal to produce (e.g., generate) a filtered signal as an output to the flux line component 130. In response to receiving the filtered signal, the flux line component 130, comprising the flux coupler component 132, can produce a desirable magnetic field and flux that can be applied by the flux coupler component 132 to the SQUID loop 114, which can be in relatively close proximity to the flux coupler component 132 (and flux line component 130), to facilitate desirably (e.g., improvedly, suitably, acceptably, or optimally) tuning a frequency of the device 100 (e.g., of the qubit components 106 and 108 of the device 100). The flux coupler component 132 can be coupled to the SQUID loop 114, and associated coupler component 112 and qubit components 106 and 108, through a desired mutual inductance, wherein the mutual inductance can range from approximately 1.0 to 2.0 picohenries (pH) (e.g., approximately 0.5 to 1.0 $\phi_0$/milliamps (mA)), or can have another desired mutual inductance that can be less than 1.0 pH or greater than 2.0 pH. In some embodiments, the filter component 128 can be terminated by an inductive load that can range from approximately 10.0 pH to 500 pH. The filter component 128 can desirably mitigate (e.g., reduce, minimize, or suppress) electrical noise and Purcell decay that would otherwise be associated with applying the raw (e.g., unprocessed) input signal to the flux line and can enhance performance and efficiency of the device 100. The filter component 128 also can desirably filter the input signal so as to not undesirably distort the signals (e.g., filtered signals) applied to the flux line component 130. In certain embodiments, the flux line component 130 can be desirably extended and routed underneath qubit components (e.g., qubit component 106 or qubit component 108) and/or coupler component(s) 112 without undesirable, significant, or additional Purcell loss.

In accordance with various embodiments, respective portions of the filter component 128 can be formed on the first chip 103 (e.g., first substrate component 110 of the first chip 103) and the second chip 104 (e.g., second substrate component 126 of the second chip 104), as more fully described herein. For instance, the filter component 128 can comprise one or more inductor components (not explicitly shown in FIG. 1; as shown in other figures and described herein) and one or more capacitor components (not explicitly shown in FIG. 1; as shown in other figures and described herein) that can be respectively situated and arranged on the first substrate component 110 and/or second substrate component 126 to form an LC filter, an LCL filter, or one or more filter stages (e.g., LC filter stages) of the filter component 128. To facilitate connecting respective components (e.g., inductor component, capacitor component, pad component, or other component) of the filter component 128 to each other, the filter component 128 can comprise one or more bump bond components (not explicitly shown in FIG. 1; as shown in other figures and described herein) that can extend from the first substrate component 110 to the second substrate component 126, as more fully described herein. In accordance with various embodiments, the respective inductor component(s) and capacitor component(s) of the filter component 128 can be arranged to into a Gaussian filter configuration or a Bessel-Thompson filter configuration.

The device 100 also can comprise various connector components (e.g., conductive connectors), such as, for example, connector component 134, connector component 136, connector component 138, and connector component 140. For instance, connector component 134 can connect the qubit component 106 to capacitor component 120, connector component 136 can connect the capacitor component 120 to the coupler component 112, connector component 138 can connect the coupler component 112 to the capacitor component 122, and connector component 140 can connect the capacitor component 122 to the qubit component 108.

The various components (e.g., qubit components 106 and 108, coupler component 112, SQUID loop 114, capacitor components 120 and 122, input line component 124, filter component 128, flux line component 130, flux coupler component 132, and other components), connector components (e.g., 134, 136, 138, and 140), and circuitry of the device 100 can be formed or created on the first substrate component 110 or second substrate component 126 by depositing one or more metallization layers on the first substrate component 110 and second substrate component 126, wherein the one or more metallization layers can be formed of one or more desired metal or conductive materials, which can be or include one or more desired superconductive materials (e.g., a niobium-type superconducting material), and wherein a metallization layer can have a desired thickness or height (e.g., thickness or height on the order of nanometers). A removal or etching process (e.g., chemical etching process), and/or another desired process, can be performed on the metallization layers on the first substrate component 110 and the second substrate component 126 to desirably and selectively remove or etch away portions of the metallization layers where the remaining portions of the metallization layers can form and comprise the various components and circuitry of the device 100, as more fully described herein.

Figure 2:
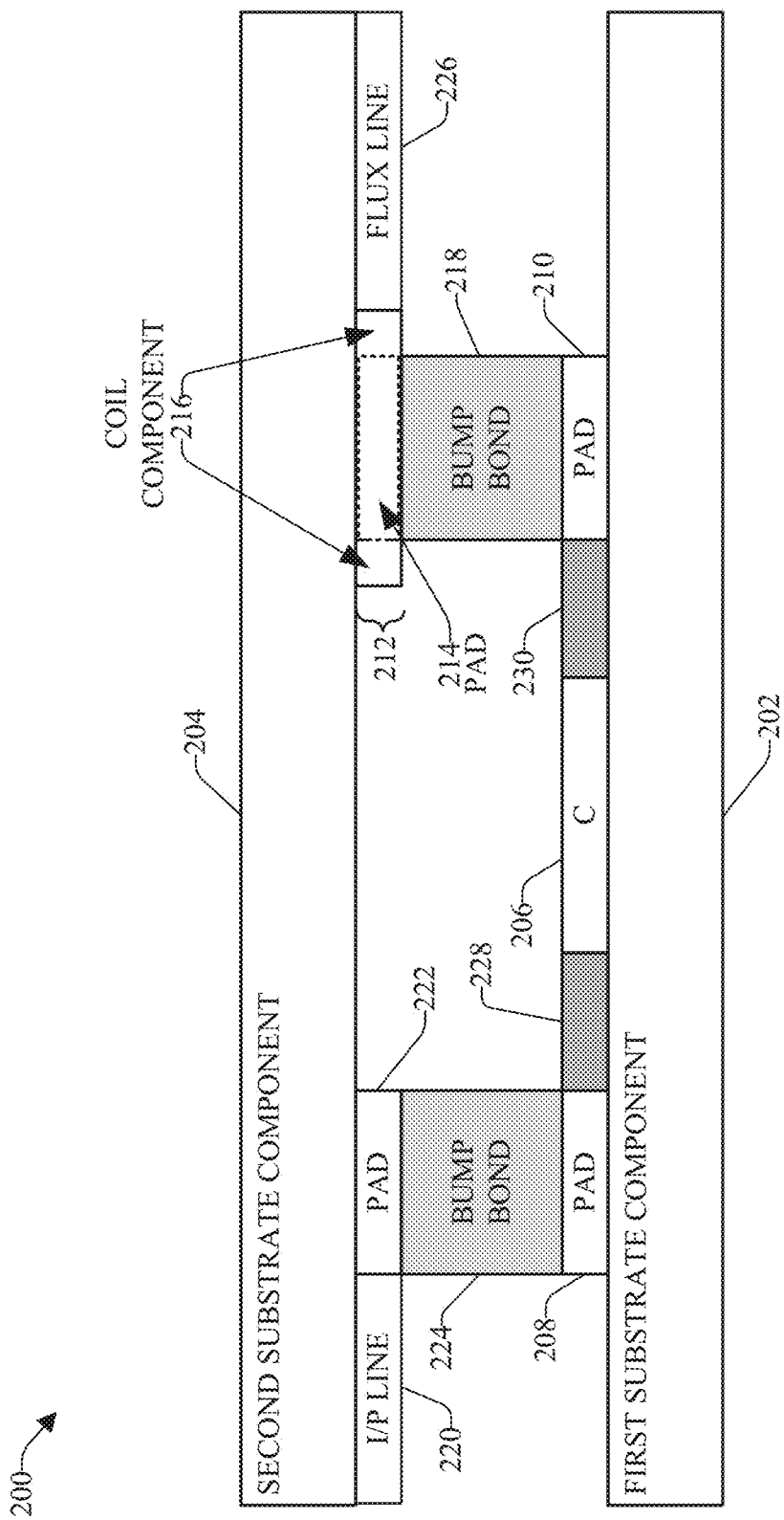
FIG. 2 depicts a diagram of an example filter component that can desirably filter an input signal to provide a desirable filtered signal and reduce Purcell loss of the coupler and qubit devices, in accordance with various aspects and embodiments of the disclosed subject matter.

Referring to FIG. 2, FIG. 2 depicts a diagram of an example filter component 200 that can desirably filter (e.g., low pass filter) an input signal to provide a desirable (e.g., enhanced, suitable, acceptable, or optimal) filtered signal and reduce Purcell loss of the coupler and qubit devices, in accordance with various aspects and embodiments of the disclosed subject matter. The filter component 200 can comprise a first substrate component 202, which can be on a first chip (e.g., qubit chip), and a second substrate component 204, which can be on a second chip (e.g., interposer chip), of a device (e.g., qubit device). In some embodiments, the first chip and the second chip can be arranged in relation to each other to form a flip-chip package, such as described herein. The first substrate component 202 and the second substrate component 204 can be formed of a desired material(s), such as a silicon-based material (e.g., a silicon-type dielectric substrate), and can have a desired size (e.g., length, width, and thickness or height) and shape, wherein the thickness or height of each of the substrate components 202 and 204 can be on the order of micrometers (μm), for example. The filter component 200 can be an LC filter, such as a low pass LC filter, that can have a desired cutoff frequency that can range from approximately 1.0 gigahertz (GHz) to 2.0 GHz, for example. In some embodiments, the filter component 200 can be a lumped element low pass filter. The filter component 200 can desirably mitigate (e.g., reduce, minimize, or suppress) electrical noise and Purcell decay that would otherwise be associated with applying a raw (e.g., unprocessed) input signal to the flux line and can enhance performance and efficiency of the qubit device. The filter component 200 also can desirably filter the input signal so as to not undesirably distort the signals (e.g., filtered signals) applied to the flux line component.

In some embodiments, a capacitor component 206 (e.g., capacitor) can be formed (e.g., fabricated) or situated on the first substrate component 202, for example, between a pad component (PAD) 208 and a pad component 210, which can be formed or situated on the first substrate component 202. The pad components 208 and 210 can facilitate connecting components to each other and/or establishing a connection between the first substrate component 202 and the second substrate component 204 (e.g., via a bump bond component). The capacitor component 206 can be associated with (e.g., connected to) the pad components 208 and 210. In accordance with various embodiments, the capacitor component 206 can have a capacitance that can range from approximately 0.5 picofarad (pF) to 1.5 pF (e.g., 1.0 pF), or can have a capacitance that can be less than 0.5 pF or greater than 1.5 pF. In certain embodiments, the capacitor component 206 can be or can comprise a planar capacitor, such as an interdigitated finger capacitor. In other embodiments, the capacitor component 206 can be or can comprise a parallel plate capacitor, which can have a terminal connected to ground (e.g., connected to a ground plane formed on the first substrate component 202).

Figure 3:
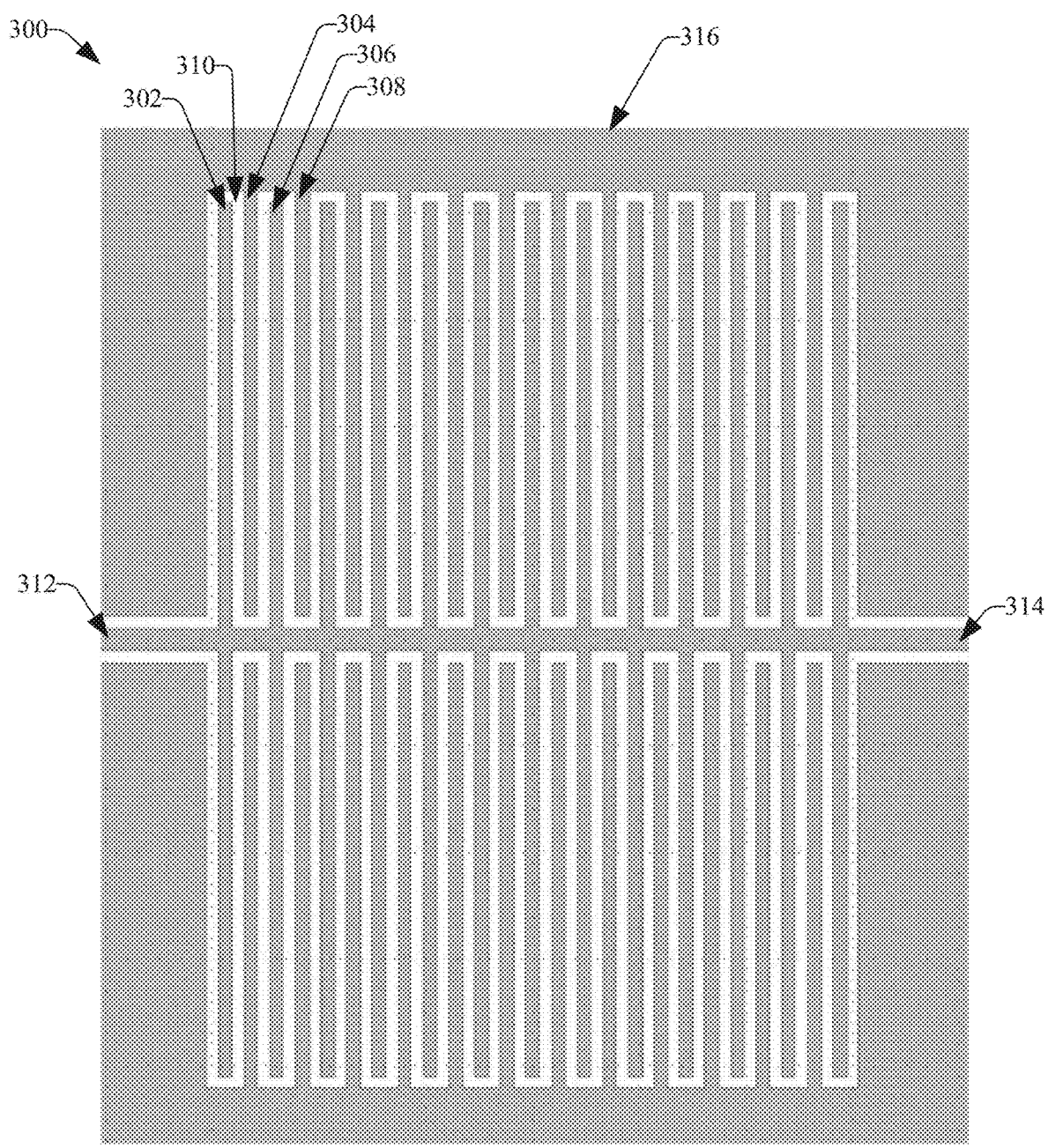
FIG. 3 depicts a diagram of a top view of an example interdigitated finger capacitor component, in accordance with various aspects and embodiments of the disclosed subject matter.

In certain embodiments, an inductor component 212 can be formed or situated on the second substrate component 204, for example, in proximity to a pad component 214, which can be part of the inductor component 212, for instance, when a coil component 216, comprising one or more windings (e.g., turns) of the inductor component 212, are formed around the pad component 214 (e.g., which can function as a conductor portion of the inductor component 212) to achieve the desired amount of inductance. In accordance with various embodiments, the inductor component 212 can have an inductance that can range from approximately 7.0 nanohenries (nH) to 7.5 nH (e.g., 7.3 nH), or can have another inductance level that can be less than 7.0 nH or greater than 7.5 nH. In some embodiments, the inductor component 212 can be a spiral inductor (e.g., as depicted in FIG. 3) that can spiral around the pad component 214 (e.g., conductor portion of the inductor component 212). In other embodiments, the inductor component 212 can be a meandered line inductor.

To facilitate forming the LC filter of the filter component 200, the filter component 200 can comprise a bump bond component (BUMP BOND) 218 that can be associated with (e.g., connected to) the pad component 210 on the first substrate component 202 and can extend from the pad component 210 to the inductor component 212 on the second substrate component 204 (e.g., to an inner coil lead of the coil component 216 of the inductor component 212). Since the pad component 210 can be associated with the capacitor component 206, the inductor component 212 can be associated with (e.g., connected to) the capacitor component 206 via the bump bond component 218 and the pad component 210. In some embodiments, the capacitor component 206 can be placed before the inductor component 212 in the circuit of the filter component 200 to avoid or mitigate loading by an inductive load (e.g., if not, and if the capacitor were to be in parallel with a small inductive load of approximately 180 pH, the small inductive load could essentially short out the capacitor, which can be undesirable).

In certain embodiments, an input line component 220 can be formed or situated on the second substrate component 204, and can be associated with (e.g., connected to) the filter component 200 by connecting to a pad component 222 formed or situated on the second substrate component 204. To facilitate connecting the input line component 220 to the capacitor component 206 of the LC filter, a bump bond component 224 can be formed to connect to the pad component 222 on the second substrate component 204 and extend to the pad component 208 on the first substrate component 202.

The filter component 200 (e.g., an output of the filter component 200) also can be associated with (e.g., connected to) a flux line component 226 that can be formed or situated on the second substrate component 204 (a flux line portion of the flux line component 226 is depicted in FIG. 2, and can extend to the flux coupler component of the flux line component, such as described herein). For instance, the flux line component 226 can be connected to an outer coil lead of the coil component 216 of the inductor component 212. The filter component 200 can desirably filter an input signal applied to the input line component 220 to produce a desirable filtered signal (e.g., low pass filtered signal) that can be output to the flux line component 226 to facilitate tuning a frequency of the qubit device, such as more fully described herein.

The filter component 200 also can comprise various connector components (e.g., conductive connectors), such as, for example, connector component 228 and connector component 230. For instance, connector component 228 can connect the pad component 208 to capacitor component 206, and connector component 230 can connect the capacitor component 206 to the pad component 210.

FIG. 3 depicts a diagram of a top view of an example interdigitated finger capacitor component 300, in accordance with various aspects and embodiments of the disclosed subject matter. In some embodiments, a filter component, such as described herein, can employ an interdigitated finger capacitor component, such the interdigitated finger capacitor component 300, to facilitate creation of a desired filter (e.g., an LC or LCL low pass filter) that can be employed to filter an input signal to produce a filtered signal (e.g., low pass filtered signal) that can be applied to the flux line component of a qubit device, as more fully described herein.

The interdigitated finger capacitor component 300 can comprise a multi-finger structure that can be arranged to produce a desired capacitance. In some embodiments, the interdigitated finger capacitor component 300 can employ lumped circuit elements. The interdigitated finger capacitor component 300 can comprise a set of finger components, such as, for example, finger component 302, finger component 304, finger component 306, and finger component 308, that can be arranged in an interdigitated manner with a desired amount of space (e.g., space 310) between adjacent finger components (e.g., finger component 302 and finger component 304). The interdigitated finger capacitor component 300 also can comprise a terminal 312 and a terminal 314 that can be used to connect the interdigitated finger capacitor component 300 to other components of the circuitry (e.g., of a qubit device). The set of finger components (e.g., 302, 304, 306, and 308), the terminals (e.g., 312 and 314), and surrounding capacitor structure 316 can be formed of a desired conductive material, and can be formed on a substrate component using a desired fabrication, removal, or etching process, such as more fully described herein. Capacitance can be produced across the space or gap between respective finger components (e.g., 302, 304, 306, and 308) of the set of finger components. The capacitance level of the interdigitated finger capacitor component 300 can be based at least in part on the width of the finger components (e.g., 302, 304, 306, and 308), the length of the finger components, the amount of space in between the finger components, the number of finger components, the number of spaces, and/or other factors or parameters associated with the interdigitated finger capacitor component 300.

Figure 4:
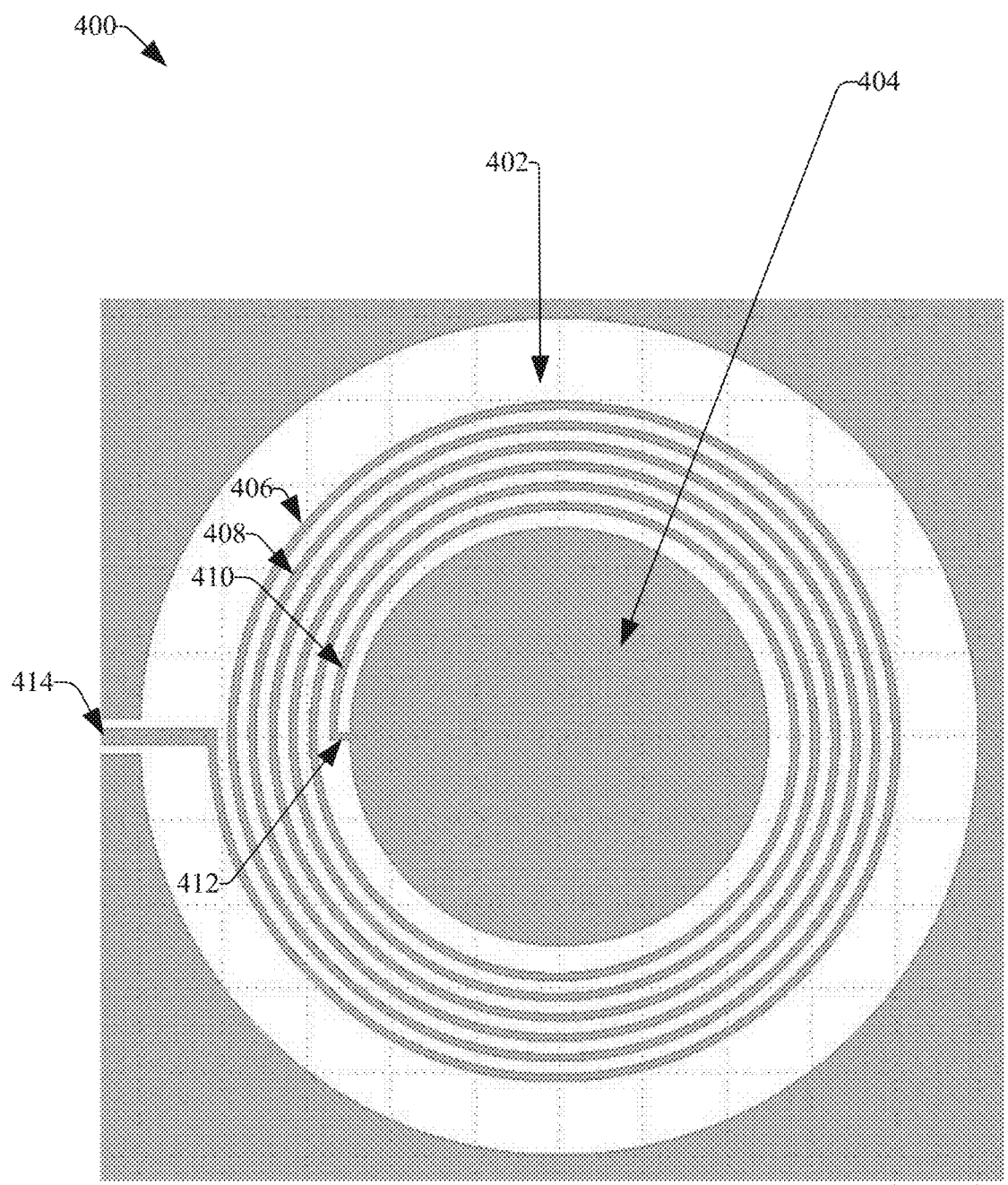
FIG. 4 illustrates a diagram of a top view of an example spiral inductor component, in accordance with various aspects and embodiments of the disclosed subject matter.

FIG. 4 illustrates a diagram of a top view of an example spiral inductor component 400, in accordance with various aspects and embodiments of the disclosed subject matter. In some embodiments, a filter component, such as described herein, can employ a spiral inductor component, such the spiral inductor component 400, to facilitate creation of a desired filter (e.g., an LC or LCL low pass filter) that can be employed to filter an input signal to produce a filtered signal (e.g., low pass filtered signal) that can be applied to the flux line component of a qubit device, as more fully described herein. The spiral inductor component 400 can comprise a conductor portion 402 that can have a desired size and shape, and can be formed of a desired conductive material, such as described herein. In some embodiments, the conductor portion 402 can be circular (or cylindrical) or rounded in shape (e.g., circular in shape when looking at a top view of the conductor portion 402). In certain embodiments, the conductor portion 402 can be a pad component formed on a substrate component, such as described herein.

The spiral inductor component 400 also can include a coil component 404, which can comprise one or more windings, such as winding 406, winding 408, and winding 410, wherein the one or more windings (e.g., one or more turns) can be formed around, and can surround, the conductor portion 402 to facilitate producing a desired amount of inductance. The one or more windings typically can have a shape that can substantially correspond to the shape of the conductor portion 402. For instance, if the conductor portion 402 is circular (or cylindrical) in shape, the one or more windings (e.g., 406, 408, and 410) of the coil component 404 that surround the conductor portion 402 can be substantially circular in shape. The amount of inductance produced by the spiral inductor component 400 can be based at least in part on the size of the conductor portion 402, the number of windings of the coil component 404, and/or other factors or parameters associated with the spiral inductor component 400.

The spiral inductor component 400 also can comprise an inner coil lead 412 that can be associated with (e.g., connected to or integrated with) the innermost winding (e.g., winding 410) of the coil component 404, and an outer coil lead 414 that can be associated with an outermost winding (e.g., winding 406) of the coil component 404. The inner coil lead 412 and the outer coil lead 414 can be utilized to connect the spiral inductor component 400 to other components or circuitry of a qubit device, for example, to facilitate forming a filter component (e.g., an LC or LCL low pass filter component), such as more fully described herein.

Figure 5:
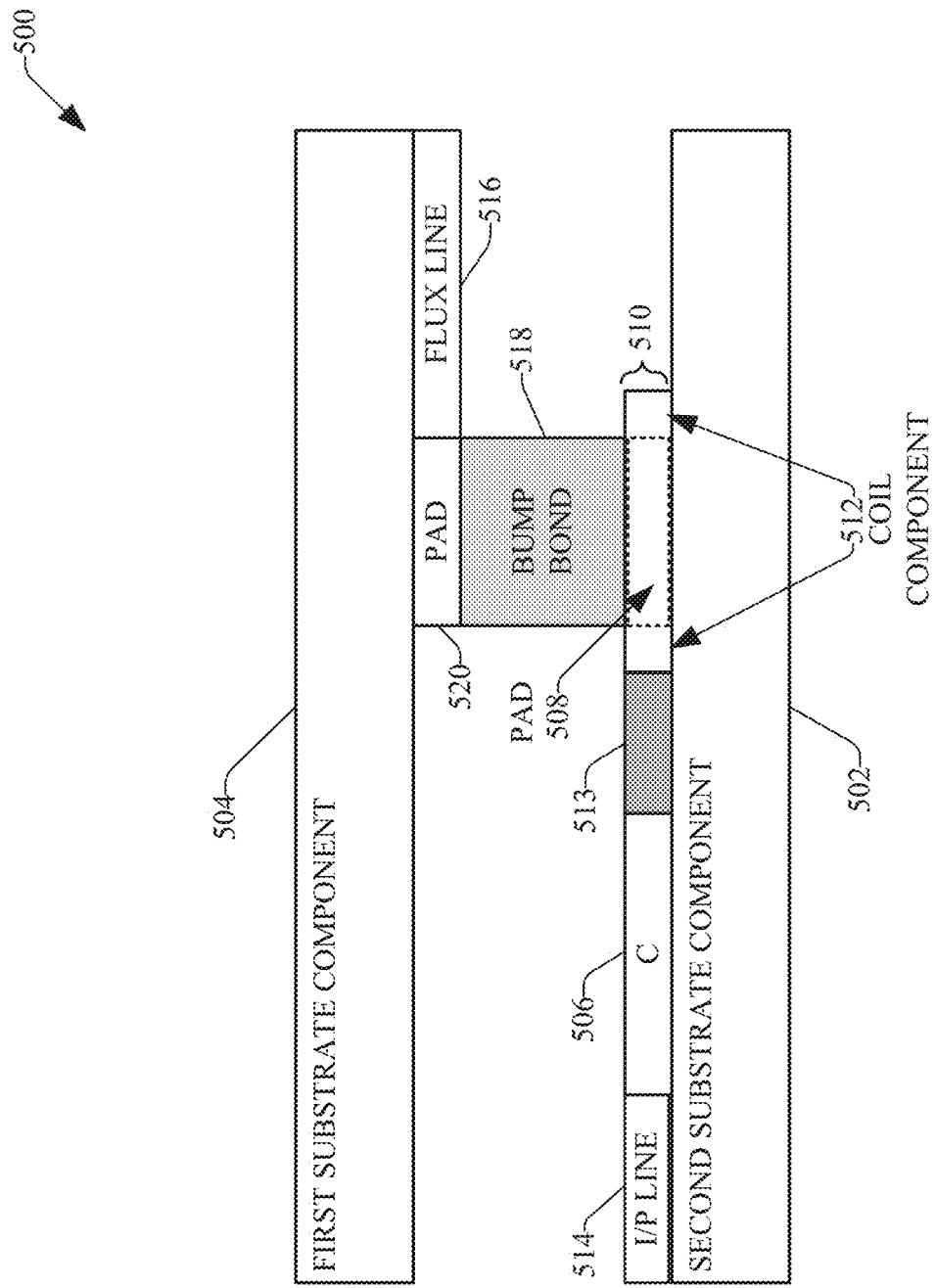
FIG. 5 illustrates another diagram of an example filter component that can desirably filter an input signal to provide a desirable filtered signal and reduce Purcell loss of the coupler and qubit devices, in accordance with various aspects and embodiments of the disclosed subject matter.

Turning to FIG. 5, FIG. 5 illustrates a diagram of an example filter component 500 that can desirably filter (e.g., low pass filter) an input signal to provide a desirable (e.g., enhanced, suitable, acceptable, or optimal) filtered signal and reduce Purcell loss of the coupler and qubit devices, in accordance with various aspects and embodiments of the disclosed subject matter. The filter component 500 can comprise a first substrate component 502, which can be on a first chip (e.g., qubit chip), and a second substrate component 504, which can be on a second chip (e.g., interposer chip), of a device (e.g., qubit device). In some embodiments, the first chip and the second chip can be arranged in relation to each other to form a flip-chip package, such as described herein. The first substrate component 502 and the second substrate component 504 can be formed of a desired material(s), such as a silicon-based material. The filter component 500 can be an LC filter, such as a low pass LC filter, that can have a desired cutoff frequency that can range from approximately 1.0 gigahertz (GHz) to 2.0 GHz, for example. In some embodiments, the filter component 500 can be a lumped element low pass filter. The filter component 500 can desirably mitigate (e.g., reduce, minimize, or suppress) electrical noise and Purcell decay that would otherwise be associated with applying a raw (e.g., unprocessed) input signal to the flux line and can enhance performance and efficiency of the qubit device, as more fully described herein. The filter component 500 also can desirably filter the input signal so as to not undesirably distort the signals (e.g., filtered signals) applied to the flux line component.

In some embodiments, a capacitor component 506 (e.g., capacitor) can be formed (e.g., fabricated) or situated on the first substrate component 502, for example, in proximity to a pad component 508 that can be formed or situated on the first substrate component 502 (wherein the pad component 508 can be part of inductor component 510, as described herein). In accordance with various embodiments, the capacitor component 506 can have a desired capacitance that can range from approximately 1.0 pF to 2.5 pF (e.g., 2.0 pF), or can have a capacitance that can be less than 1.0 pF or greater than 2.5 pF. For instance, the capacitor component 506 typically larger in capacitance and/or larger in size (e.g., area) than the capacitor component 506 of the LC filter, as described with regard to FIGS. 2 and 3. Also, in accordance with various embodiments, the capacitor component 506 can be or can comprise a planar capacitor (e.g., an interdigitated finger capacitor) or a parallel plate capacitor, wherein the parallel plate capacitor can have a terminal connected to ground (e.g., connected to a ground plane formed on the first substrate component 502).

In certain embodiments, an inductor component 510 can be formed or situated on the first substrate component 502, for example, in proximity to the pad component 508, which can be part of the inductor component 510, for instance, when a coil component 512, comprising one or more windings (e.g., turns) of the inductor component 510, are formed around the pad component 508 (e.g., which can function as a conductor portion of the inductor component 510) to achieve the desired amount of inductance. In accordance with various embodiments, the inductor component 510 can have an inductance that can range from approximately 7.0 nanohenries (nH) to 7.5 nH (e.g., 7.3 nH), or can have another inductance level that can be less than 7.0 nH or greater than 7.5 nH. In some embodiments, the inductor component 510 can be a spiral inductor (e.g., as depicted in FIG. 3) that can spiral around the pad component 508 (e.g., conductor portion of the inductor component 510). In other embodiments, the inductor component 510 can be a meandered line inductor.

To facilitate forming the LC filter of the filter component 500, the capacitor component 506 can be associated with (e.g., connected to) an outer coil lead of the coil component 512 of the inductor component 510 via a connector component 513. In some embodiments, the capacitor component 506 can be placed before the inductor component 510 in the circuit of the filter component 500 to avoid or mitigate loading by an inductive load, such as described herein. In certain embodiments, the capacitance level and/or the size (e.g., area) of the capacitor component 506 can be larger than the capacitor component 206 of FIG. 2, if and as desired.

In some embodiments, an input line component 514 can be formed or situated on the first substrate component 502, and can be associated with (e.g., connected to) the filter component 500) by connecting to the capacitor component 506. The filter component 500 (e.g., an output of the filter component 500) also can be associated with (e.g., connected to) a flux line component 516 that can be formed or situated on the second substrate component 504 (a flux line portion of the flux line component 516 is depicted in FIG. 4 that can extend to the flux coupler component, such as described herein). To facilitate connecting the LC filter to the flux line component 516, a bump bond component 518 can be formed to connect to the inner coil lead of the coil component 512 of the inductor component 510, and can extend from the inner coil lead to a pad component 520 that can be formed or situated on the second substrate component 504, wherein the flux line component 516 can be connected to the pad component 520. The filter component 500 can desirably filter an input signal applied to the input line component 514 to produce a desirable filtered signal (e.g., low pass filtered signal) that can be output to the flux line component 516 to facilitate tuning a frequency of the qubit device, such as more fully described herein.

Figure 6:
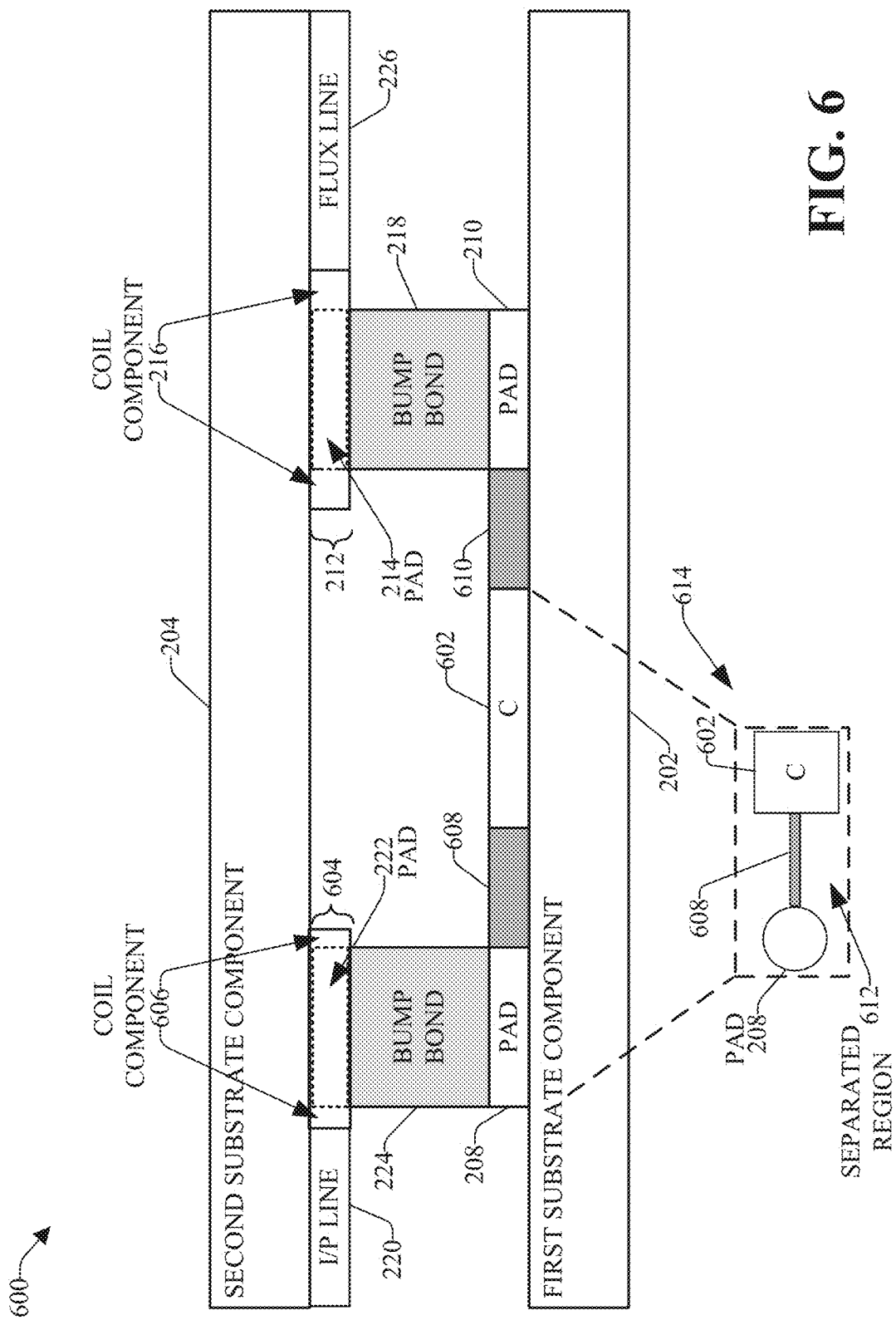
FIG. 6 depicts a diagram of an example filter component that can employ an inductor-capacitor-inductor (LCL) filter to desirably filter an input signal to provide a desirable filtered signal and reduce Purcell loss of the coupler and qubit devices, in accordance with various aspects and embodiments of the disclosed subject matter.

FIG. 6 depicts a diagram of an example filter component 600 that can employ an LCL filter to desirably filter (e.g., low pass filter) an input signal to provide a desirable (e.g., enhanced, suitable, acceptable, or optimal) filtered signal and reduce Purcell loss of the coupler and qubit devices, in accordance with various aspects and embodiments of the disclosed subject matter. In a number of aspects, the filter component 600 can be substantially the same as the filter component 200 of FIG. 2, except, for example, that the filter component 600 can comprise an LCL filter, while the filter component 200 of FIG. 2 can comprise an LC filter. The filter component 600 can comprise a first substrate component 202, which can be on a first chip (e.g., qubit chip), and a second substrate component 204, which can be on a second chip (e.g., interposer chip), of a device (e.g., qubit device). In some embodiments, the first chip and the second chip can be arranged in relation to each other to form a flip-chip package, such as described herein. The filter component 600 can be an LCL filter, such as a low pass LCL filter, that can have a desired cutoff frequency that can range from approximately 1.0 GHz to 2.0 GHz, for example.

The filter component 600 can comprise a capacitor component 602 that can be formed (e.g., fabricated) or situated on the first substrate component 202, for example, between a pad component (PAD) 208 and a pad component 210. The filter component 600 also can comprise an inductor component 212, which can be formed or situated on the second substrate component 204, for example, in proximity to a pad component 214, which can be part of the inductor component 212, for instance, when a coil component 216, comprising one or more windings (e.g., turns) of the inductor component 212, are formed around the pad component 214 (e.g., which can function as a conductor portion of the inductor component 212) to achieve the desired amount of inductance. The filter component 600 further can comprise input line component 220, pad component 222, flux line component 226, and bump bond components 218 and 224. These various components of the filter component 600 can be arranged in a same or similar manner such as described herein with regard to the filter component 200 of FIG. 2.

The capacitor component 602 of the filter component 600 (e.g., LCL filter) can have a different (e.g., larger) capacitance and/or can be a different (e.g., larger) size, or can have the same capacitance and/or can be the same size (e.g., area), as the capacitor component 206 employed in the LC filter of FIG. 2. In accordance with various embodiments, the capacitor component 602 can have a capacitance that can range from approximately 1.0 pF to 2.0 pF (e.g., 1.6 pF), or can have a capacitance that can be less than 1.0 pF or greater than 2.0 pF.

In certain embodiments, the filter component 600 can comprise another inductor component, such as inductor component 604, which can include a coil component 606 and the pad component 222, wherein the pad component 222 can function as the conductor portion of the inductor component 604. In some embodiments, the coil component 606 can have one winding, and, in other embodiments, the coil component 606 can comprise more than one winding (e.g., a relatively small number of windings), but typically can have less windings than the coil component 216 of the inductor component 212 of the filter component 600. In accordance with various embodiments, the inductor component 212 of the filter component 600 can have an inductance that can range from approximately 7.0 nH to 7.5 nH (e.g., 7.4 nH), or can have another inductance level that can be less than 7.0 nH or greater than 7.5 nH. Also, in accordance with various embodiments, the inductor component 604 can have an inductance that can range from approximately 1.0 nH to 2.0 nH (e.g., 1.5 nH), or can have another inductance level that can be less than 1.0 nH or greater than 2.0 nH, although its inductance level typically can be significantly less than the inductance level of the inductor component 212 of the filter component 600.

The filter component 600 also can comprise various connector components (e.g., conductive connectors), such as, for example, connector component 608 and connector component 610. For instance, connector component 608 can connect the pad component 208 to capacitor component 602, and connector component 610 can connect the capacitor component 602 to the pad component 210.

In some embodiments, there can be a separated (e.g., open) region 612 of a desired size (e.g., approximately 1 mm, or more or less than 1 mm) between the bump bond component 218 (or associated pad component 210) and the capacitor component 602 (e.g., as depicted in the partial top view 614 of the first chip (e.g., qubit chip) of the filter component 600), wherein the separated region 612 can be utilized for desired and desirable layout and routing over other components (e.g., resonators or other peripheral components) or other features of the qubit device, as more fully described herein.

Figure 7:
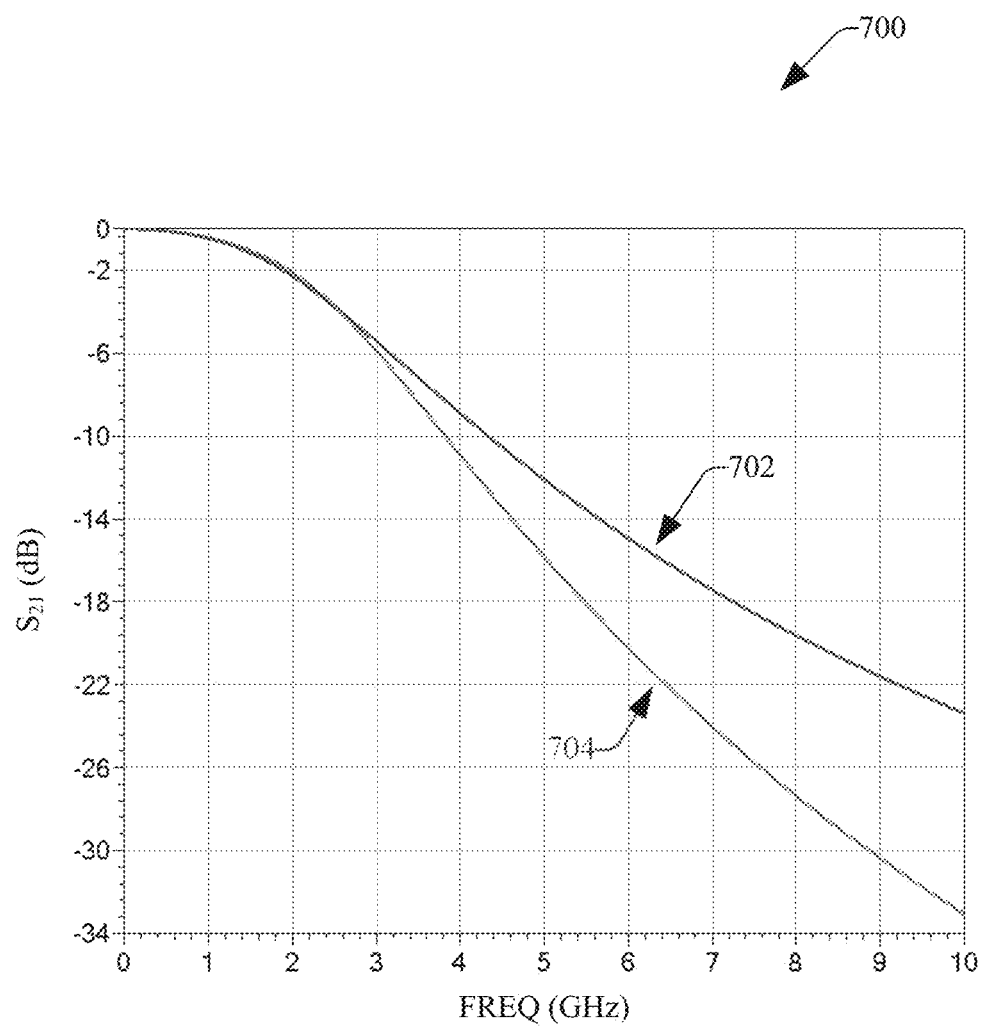
FIGS. 7 and 8 present diagrams of example graphs of filter circuit simulation results for respective filter components, in accordance with various aspects and embodiments of the disclosed subject matter.
Figure 8:
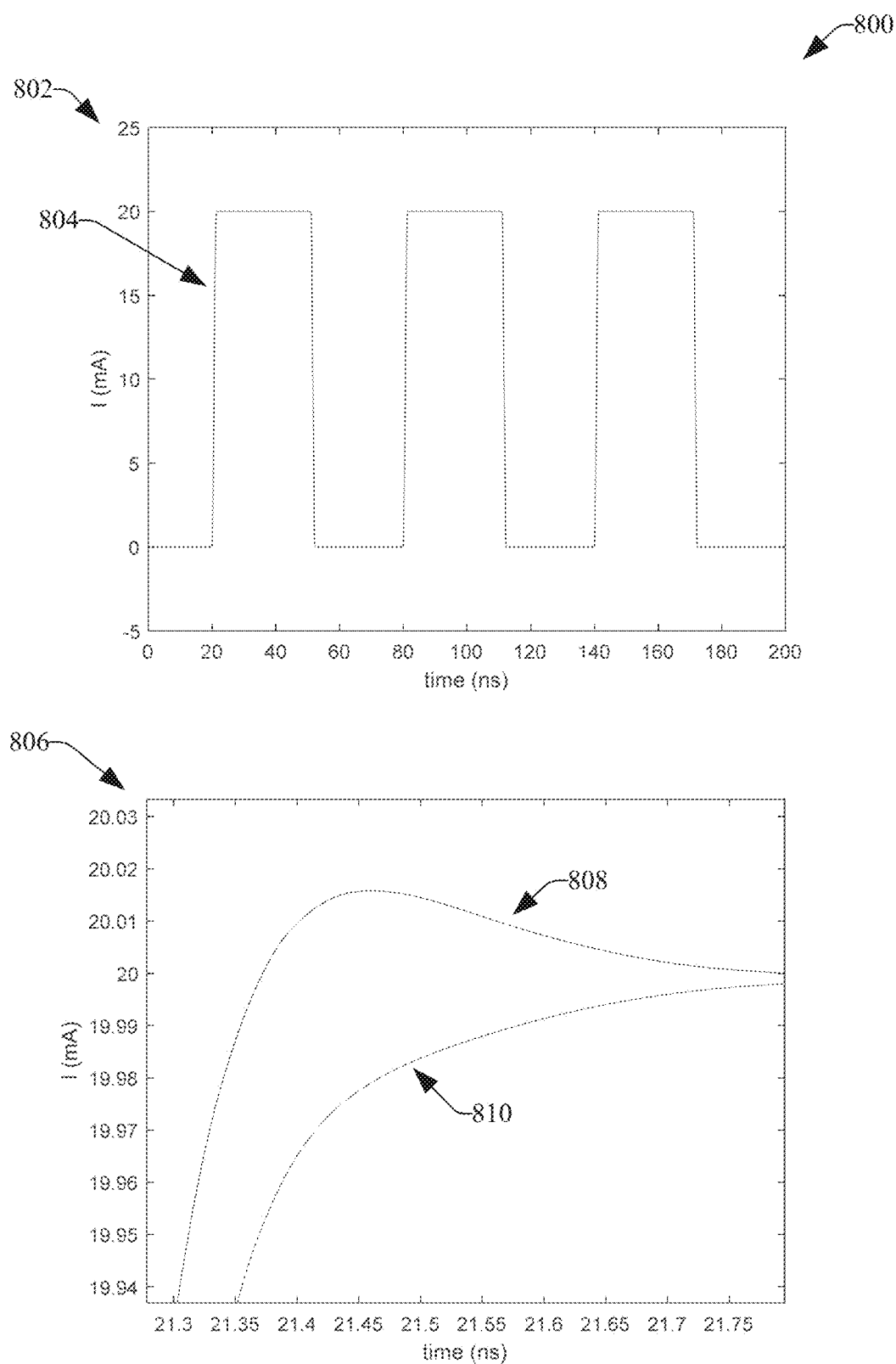

Referring briefly to FIGS. 7 and 8, (along with FIGS. 1-6), FIGS. 7 and 8 present diagrams of example graphs 700 and 800 of filter circuit simulation results for respective filter components (e.g., LC low pass filter component and LCL low pass filter component), such as described herein, in accordance with various aspects and embodiments of the disclosed subject matter. FIG. 7 presents a diagram of an example graph 700 of filter circuit simulations of frequency responses of the respective filter components (e.g., LC low pass filter component and LCL low pass filter component), such as described herein, in accordance with various aspects and embodiments of the disclosed subject matter. The graph 700 presents the frequency response 702 of the LC filter component, with regard to $S_{21}$ (also referred to as S(2,1)), in decibels (dB), as a function of frequency (freq in GHz), for transmission into a 50 ohm load associated with the LC filter component, such as described herein. $S_{21}$ can be the transmission from one port to a second port of a filter. The graph 700 also presents the frequency response 704 of the LCL filter component, with regard to $S_{21}$ as a function of frequency, for transmission into a 50 ohm load associated with the LCL filter component (e.g., Gaussian LCL filter component), such as described herein.

FIG. 8 depicts a diagram of example graphs 800 regarding a simulation of a pulse transmission into an inductive load for the respective filter components, in accordance with various aspects and embodiments of the disclosed subject matter. The example graphs 800 comprise graph 802 that illustrates a simulation of a square pulse transmission 804 into an inductive load of 180 pH, shown as current (I in mA) as a function of time (nanoseconds (ns)). The example graphs 800 also can include a graph 806, which can comprise simulation results regarding filter circuit simulations of respective time domain responses of the respective filter components (e.g., LC low pass filter component and LCL low pass filter component) when subjected to the square pulse transmission 804, in accordance with various aspects and embodiments of the disclosed subject matter. The graph 806 presents the time domain response 808 of the LC filter component, as current (I in mA) as a function of time (ns), when subjected to the square pulse transmission 804 into an inductive load of 180 pH. The graph 800 also presents the time domain response 810 of the LCL filter component, as current as a function of time, when subjected to the square pulse transmission 804 into an inductive load of 180 pH.

As can be observed from the graphs 700 and 800, there is some (e.g., relatively little) overshoot in the frequency response 702 and time domain response 808 of the LC filter component, and relatively less overshoot in the frequency response 704 and time domain response 810 of the LCL filter component. Accordingly, in some applications, the LCL filter component (e.g., Gaussian LCL filter component) can be preferable over the LC filter component, since the LCL filter component can have relatively less overshoot than the LC filter component. For the LC filter component and LCL filter component, the cutoff frequency can range from approximately 1.0 GHz to 2.0 GHz, and approximately 12 dB s to 15 dB s of attenuation can be desirably achieved in the frequency range of interest for the qubit device, and signal integrity can be desirably preserved for baseband signals.

Figure 9:
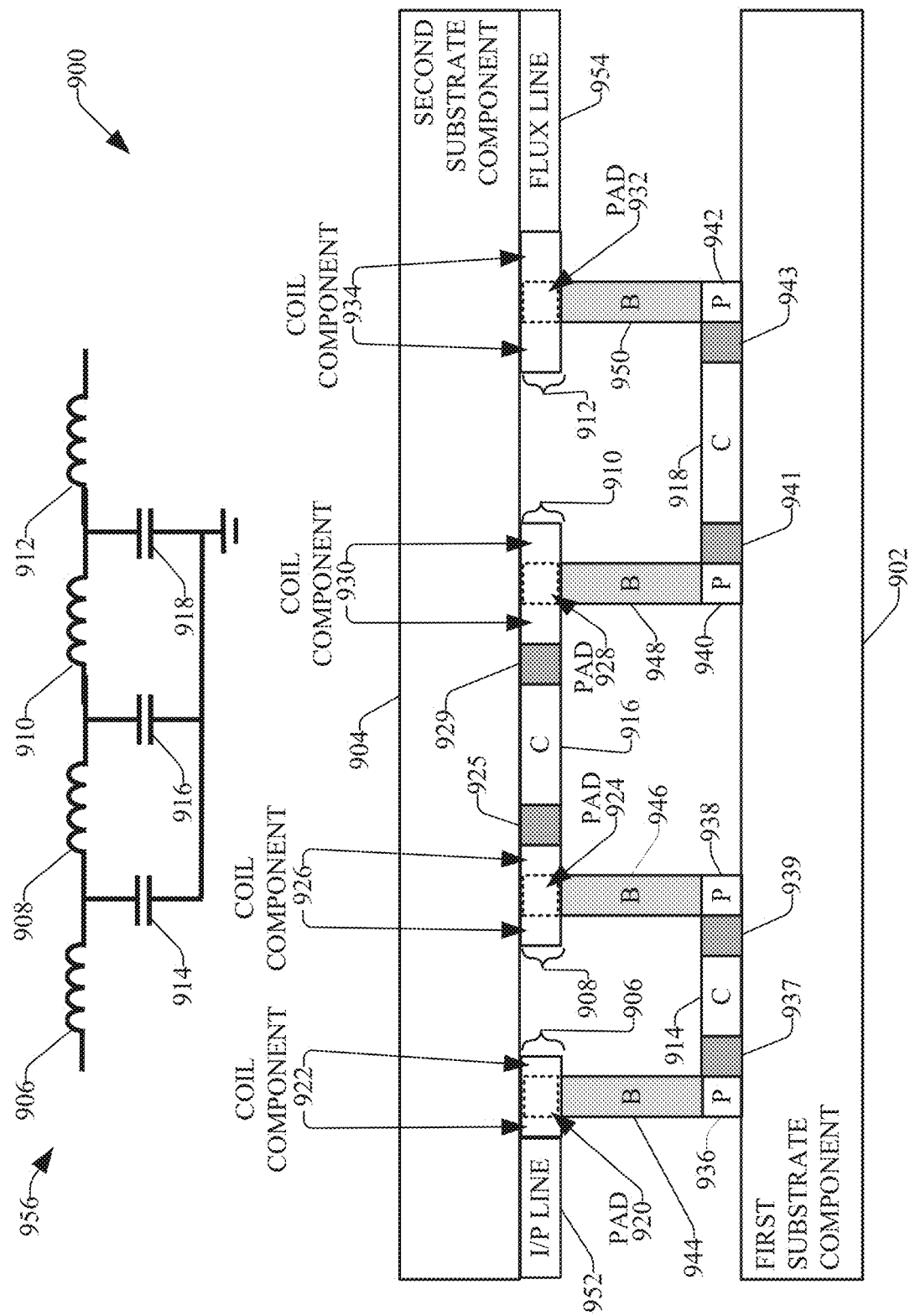
FIG. 9 illustrates a diagram of an example filter component, which can comprise higher order filtering by cascading multiple filter stages, and can desirably filter an input signal to provide a desirable filtered signal and reduce Purcell loss of the coupler and qubit devices, in accordance with various aspects and embodiments of the disclosed subject matter.

Turning to FIG. 9, FIG. 9 illustrates a diagram of an example filter component 900 (e.g., low pass filter component), which can comprise higher order filtering by cascading multiple filter stages, and can desirably filter (e.g., low pass filter) an input signal to provide a desirable (e.g., enhanced, suitable, acceptable, or optimal) filtered signal and reduce Purcell loss of the coupler and qubit devices, in accordance with various aspects and embodiments of the disclosed subject matter.

The filter component 900 can comprise a first substrate component 902, which can be on a first chip (e.g., qubit chip), and a second substrate component 904, which can be on a second chip (e.g., interposer chip), of a device (e.g., qubit device). In some embodiments, the first chip and the second chip can be arranged in relation to each other to form a flip-chip package, such as described herein. The first substrate component 902 and the second substrate component 904 can be formed of a desired material(s), such as a silicon-based material. The filter component 900 can be an LC filter, such as a low pass LC filter, that can comprise a ladder network, comprising a set of inductor components and a set of capacitor components, to realize higher order filters by cascading multiple stages (e.g., multiple LC stages) of inductor components and capacitor components. By adding additional LC stages to the filter component 900, the filter component 900 can have higher order filters that can have more stop band attenuation than a single stage LC filter component. The filter component 900, employing the multiple filter stages, can have a desired cutoff frequency that can range from approximately 100 megahertz (MHz) to 10.0 GHz, for example. In some embodiments, the filter component 900 can be a lumped element low pass filter. The filter component 900 can desirably mitigate (e.g., reduce, minimize, or suppress) electrical noise and Purcell decay that would otherwise be associated with applying a raw (e.g., unprocessed) input signal to the flux line and can enhance performance and efficiency of the qubit device. The filter component 900 also can desirably filter the input signal so as to not undesirably distort the signals (e.g., filtered signals) applied to the flux line component.

The set of inductor components can comprise inductor component 906, inductor component 908, inductor component 910, and inductor component 912, which can be formed or situated on the second substrate component 904, as more fully described herein. The set of capacitor components can comprise capacitor component 914, capacitor component 916, and capacitor component 918, which can be formed or situated on the first substrate component 902 or the second substrate component 904, for example, in an alternating manner, as more fully described herein. For instance, the capacitor component 914 can be situated on the first substrate component 902, the capacitor component 916 can be situated on the second substrate component 904 and in between the inductor component 908 and inductor component 910, and the capacitor component 918 can be situated on the first substrate component 902. If additional LC filter stages are desired, the additional LC filter stages can be formed by having the capacitor components distributed across the first substrate component 902 and second substrate component 904 in such an alternating manner (e.g., alternating between the different substrate layers).

With further regard to the set of inductor components, the inductor component 906 can be formed using pad component (PAD) 920 and coil component 922, which can be formed or situated on the second substrate component 904; the inductor component 908 can be formed using pad component 924 and coil component 926, which can be formed or situated on the second substrate component 904; the inductor component 910 can be formed using pad component 928 and coil component 930, which can be formed or situated on the second substrate component 904; and the inductor component 912 can be formed using pad component 932 and coil component 934, which can be formed or situated on the second substrate component 904. The respective inductor components 906, 908, 910, and 912 can have a respective number of windings and respective inductance levels. Typically, the inductor component 906 can have a smaller number of windings (e.g., one winding or other desired small number of windings) and a smaller inductance level than the inductor component 908; the inductor component 908 can have a smaller number of windings and a smaller inductance level than the inductor component 910; and the inductor component 910 can have a smaller number of windings and a smaller inductance level than the inductor component 912. The inductor components 906, 908, 910, and 912 can be spiral inductors (as depicted) or can be meandered line inductors.

With further regard to the set of capacitor components, the respective capacitor components 914, 916, and 918 can have respective capacitance levels and/or respective sizes (e.g., areas). For instance, typically, the capacitor component 914 can have a smaller capacitance and/or a smaller size than the capacitor component 916; and the capacitor component 916 can have a smaller capacitance and/or a smaller size than the capacitor component 918. The capacitor components 914, 916, and 918 can be planar capacitors (as depicted) or parallel plate capacitors. In some embodiments, the capacitor components 914, 916, and 918 can be interdigitated finger capacitors.

The filter component 900 can comprise bump bond components (B) that can connect the inductor components 906, 908, 910, and 912 on the second substrate component 904 to the first substrate component 902 (e.g., pad components on the first substrate component 902) to facilitate connecting respective inductor components 906, 908, 910, and 912 to respective capacitor components 914 and 918 on the first substrate component 902 and forming the ladder network comprising multiple LC filter stages. The first substrate component 902 can comprise pad components (P) 936, 938, 940, and 942, which can be distributed across the first substrate component 902, wherein the capacitor component 914 can be situated between, and connected to, pad component 936 and pad component 938 via connector components 937 and 939, respectively, and wherein the capacitor component 918 can be situated between, and connected to, pad component 940 and pad component 942 via connector components 941 and 943, respectively.

A bump bond component 944 can be formed and can connect the pad component 936 on the first substrate component 902 to an inner coil lead of the coil component 922 of the inductor component 906 on the second substrate component 904 to facilitate associating (e.g., connecting) the inductor component 906 with (or to) the capacitor component 914. A bump bond component 946 can be formed and can connect the pad component 938 on the first substrate component 902 to an inner coil lead of the coil component 926 of the inductor component 908 on the second substrate component 904 to facilitate associating (e.g., connecting) the inductor component 908 with (or to) the capacitor component 914. A bump bond component 948 can be formed and can connect the pad component 940 on the first substrate component 902 to an inner coil lead of the coil component 930 of the inductor component 910 on the second substrate component 904 to facilitate associating (e.g., connecting) the inductor component 910 with (or to) the capacitor component 918. A bump bond component 950 can be formed and can connect the pad component 942 on the first substrate component 902 to an inner coil lead of the coil component 934 of the inductor component 912 on the second substrate component 904 to facilitate associating (e.g., connecting) the inductor component 912 with (or to) the capacitor component 918.

The capacitor component 916 can be situated between inductor component 908 and inductor component 910 on the second substrate component 904. The capacitor component 916 can be associated with (e.g., connected to) an outer coil lead of the coil component 926 of the inductor component 908 via a connector component 925, and can be associated with an outer coil lead of the coil component 930 of the inductor component 910 via a connector component 929.

In certain embodiments, an input line component 952 can be formed or situated on the second substrate component 904, and can be associated with (e.g., connected to) the filter component 900 by connecting the input line component 952 to an outer coil lead of the coil component 922 of the inductor component 906. The filter component 900 (e.g., an output of the filter component 900) also can be associated with (e.g., connected to) a flux line component 954 that can be formed or situated on the second substrate component 904 (a flux line portion of the flux line component 954 is depicted in FIG. 9 and can extend to the flux coupler component of the flux line component, such as described herein). For instance, the flux line component 954 can be connected to an outer coil lead of the coil component 934 of the inductor component 912. In some embodiments, the last component of the filter component 900 can be the inductor component 912, which can be a series inductor to the inductive load at the output of the filter component 900, so as not to have a capacitor in parallel with the inductive load. As depicted in FIG. 9, for purposes of illustration, the circuit 956 can present the multi-stage LC filter circuit of the filter component 900 in schematic form. The filter component 900 can desirably filter an input signal applied to the input line component 952 to produce a desirable filtered signal (e.g., low pass filtered signal) that can be output to the flux line component 954 to facilitate tuning a frequency of the qubit device, such as more fully described herein.

Figure 10:
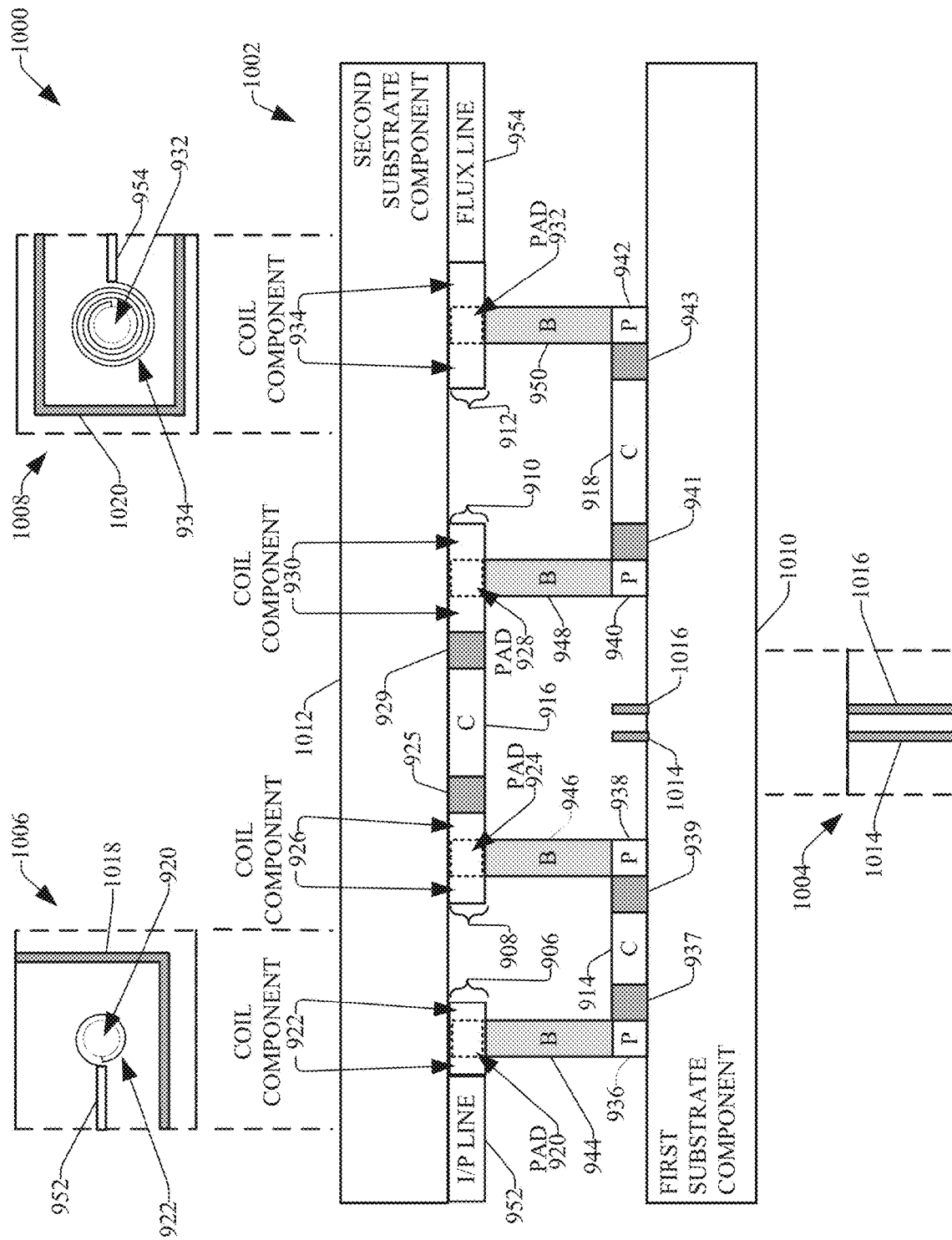
FIG. 10 depicts a diagram of an example filter component, which can comprise higher order filtering by cascading multiple filter stages, can desirably filter an input signal to provide a desirable filtered signal and reduce Purcell loss of the coupler and qubit devices, and can enable desirable routing or arranging of access lines and/or peripheral devices, in accordance with various aspects and embodiments of the disclosed subject matter.

Turning to FIG. 10, FIG. 10 depicts a diagram of an example filter component 1000 (e.g., low pass filter component), which can comprise higher order filtering by cascading multiple filter stages, can desirably filter (e.g., low pass filter) an input signal to provide a desirable (e.g., enhanced, suitable, acceptable, or optimal) filtered signal and reduce Purcell loss of the coupler and qubit devices, and can enable desirable routing or arranging of access lines and/or peripheral devices, in accordance with various aspects and embodiments of the disclosed subject matter. The filter component 1000 can comprise substantially the same arrangement of components and circuitry as the filter component 900 of FIG. 9, and the filter component 1000 can further enable desirable routing of access lines and/or peripheral devices in relation to the various components of the filter component 1000 and qubit device with which the filter component 1000 can be associated (e.g., part of or connected to). The diagram of the example filter component 1000 includes a side view 1002 of the filter component 1000, as well as a first top view 1004 of a first portion of the filter component 1000, a second top view 1006 of a second portion of the filter component 1000, and a third top view 1008 of a third portion of the filter component 1000, to facilitate illustrating certain aspects and embodiments of the disclosed subject matter.

The filter component 1000 can comprise a first substrate component 1010, which can be on a first chip (e.g., qubit chip), and a second substrate component 1012, which can be on a second chip (e.g., interposer chip), of a device (e.g., qubit device). In some embodiments, the first chip and the second chip can be arranged in relation to each other to form a flip-chip package, such as described herein. The first substrate component 1010 and the second substrate component 1012 can be formed of a desired material(s), such as a silicon-based material. The filter component 1000 can be an LC filter, such as a low pass LC filter, that can comprise a ladder network, comprising a set of inductor components and a set of capacitor components, to realize higher order filters by cascading multiple stages (e.g., multiple LC stages) of inductor components and capacitor components, as more fully described herein.

The filter component 1000 can comprise the set of inductor components (e.g., 906, 908, 910, and 912), the set of capacitor components (C) (e.g., 914, 916, and 918), pad components (PAD or P) (e.g., 920, 924, 928, 932, 936, 940, and 942), connector components (e.g., 925, 929, 937, 939, 941, and 943), and bump bond components (B) (e.g., 944, 946, 948, and 950) that can be respectively situated or formed on the first substrate component 1010 and second substrate component 1012, such as more fully described herein. The input of the filter component 1000 can be formed on the second substrate component 1012 and can be associated with (e.g., connected to) the input line component 952, which can be formed on the second substrate component 1012, as more fully described herein. The output of the filter component 1000 can be formed on the second substrate component 1012, and can be associated with (e.g., connected to) the flux line component 954, which can be formed on the second substrate component 1004, as more fully described herein.

Due in part to the multi-level flip-chip filter structure of the filter component 1000, including the distribution of respective components of the filter component 1000 across the first and second substrate components 1010 and 1012, there can be spaces or separated regions that can be available on the first and second substrate components 1010 and 1012 for desirable routing of access lines and/or components (e.g., resonators or other peripheral devices). For instance, as depicted in the first top view 1004 of the first portion (e.g., a portion of the first chip) of the filter component 1000, access line 1014 and access line 1016 can be formed or situated on, and across, the first substrate component 1010 between pad component 938 and pad component 940, due in part to the capacitor component 916 being situated on the second substrate component 1012 (over the region of the first substrate component 1010 where the access lines 1014 and 1016 are formed), rather than the first substrate component 1010, and due in part to there being no other circuitry or components in that region.

As another example, as depicted in the second top view 1006 of the second portion (e.g., a portion of the second chip) of the filter component 1000, access line 1018 can be formed or situated on the second substrate component 1012, with a first portion of the access line 1018 situated along a first side of the inductor component 906 and a second portion of the access line 1018 situated along an adjacent side of the inductor component 906 between inductor component 906 and inductor component 908, due in part to the capacitor component 914 being situated on the first substrate component 1010 (underneath the region of the second substrate component 1012 where the second (e.g., adjacent portion) of the access line 1018 is formed), rather than the second substrate component 1012, and due in part to there being no other circuitry or components in those regions of the second substrate component 1012. As still another example, as depicted in the third top view 1008 of the third portion (e.g., another portion of the second chip) of the filter component 1000, access line 1020 can be formed or situated on the second substrate component 1012, with a first portion of the access line 1020 situated along a first side of the inductor component 912, a second portion of the access line 1020 situated along an adjacent side of the inductor component 912 between inductor component 910 and inductor component 912, and a third portion of the access line 1020 situated along a third side of the inductor component 912 that is opposite the first side of the inductor component 912, due in part to the capacitor component 918 being situated on the first substrate component 1010 (underneath the region of the second substrate component 1012 where the second (e.g., adjacent portion) of the access line 1020 is formed), rather than the second substrate component 1012, and due in part to there being no other circuitry or components in those regions of the second substrate component 1012. It is to be appreciated and understood that the access lines (e.g., 1014, 1016, 1018, and 1020) depicted in FIG. 10 are merely exemplary, and, in accordance with the disclosed subject matter, more, less, or different (e.g., differently structured, or differently sized) access lines and/or peripheral devices can be formed or situated on the first substrate component 1010 and/or second substrate component 1012, or in proximity to the filter component 1000 or associated qubit device, if and as desired, to facilitate desirable (e.g., efficient, suitable, or optimal) designing, structuring, and formation of the qubit device.

Figure 11:
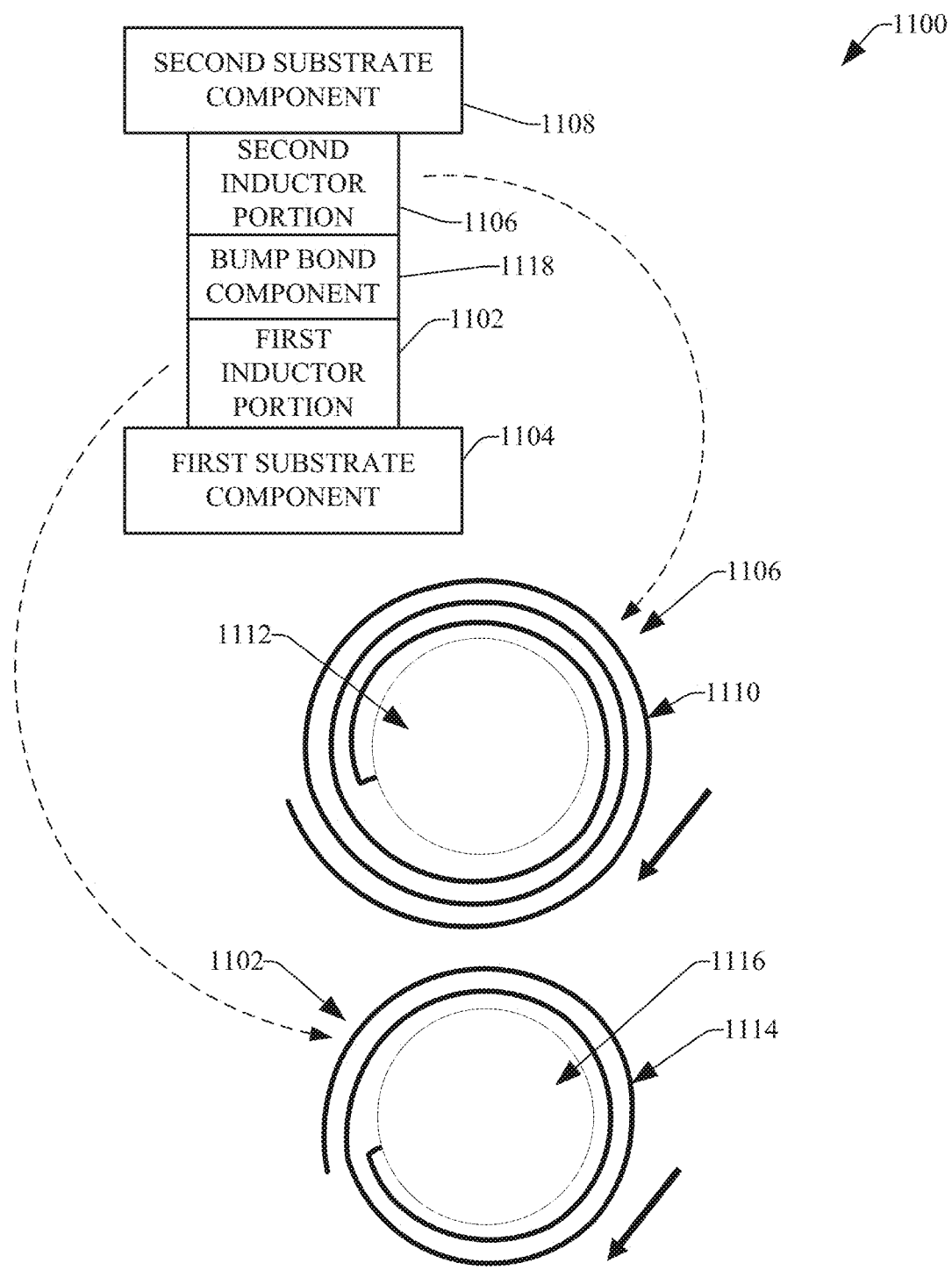
FIG. 11 depicts a diagram of an example distributed spiral inductor component that can respective winding portions oriented in the same direction, and can be utilized in a filter component, in accordance with various aspects and embodiments of the disclosed subject matter.

Turning to FIG. 11, FIG. 11 depicts a diagram of an example distributed spiral inductor component 1100 that can respective winding portions oriented in the same direction, and can be utilized in a filter component (e.g., low pass filter component), in accordance with various aspects and embodiments of the disclosed subject matter. The distributed spiral inductor component 1100 can comprise a first inductor portion 1102 that can be formed on a first substrate component 1104 of a first chip (e.g., qubit chip), and a second inductor portion 1106 that can be formed on a second substrate component 1108 of a second chip (e.g., interposer chip), wherein the first chip and second chip can be arranged to form a flip-chip package, as more fully described herein.

The first inductor portion 1102 can comprise a first coil portion 1110 and a first pad component 1112 (which can function as a first conductor portion of the first inductor portion 1102). The first coil portion 1110 can comprise one or more windings that can be oriented in a first direction (e.g., clockwise direction; or alternatively, counterclockwise direction). The second inductor portion 1106 can comprise a second coil portion 1114 and a second pad component 1116 (which can function as a second conductor portion of the second inductor portion 1106). The second coil portion 1114 can comprise one or more windings that can be oriented in the first direction (e.g., the same direction as the windings of the first coil portion 1110).

To facilitate forming the distributed spiral inductor component 1100, the first coil portion 1110 situated on the first substrate component 1104 can be associated with (e.g., connected to) the second coil portion 1114 situated on the second substrate component 1108 via a bump bond component 1118 that can extend (e.g., span) from the first substrate component 1104 to the second substrate component 1108. For instance, one end of the bump bond component 1118 can be connected to the inner coil lead of the first coil portion 1110 of the first inductor portion 1102, and the other end of the bump bond component 1118 can be connected to an inner coil lead of the second coil portion 1114 of the second inductor portion 1106.

The amount of inductance that can be generated (e.g., produced) by the distributed spiral inductor component 1100 can be based at least in part on the number of windings of the first coil portion 1110 and the number of windings of the second coil portion 1114, and also the fact that the windings of the first coil portion 1110 and the windings of the second coil portion 1114 are in the same first direction. By having the windings of the first coil portion 1110 and the windings of the second coil portion 1114 proceed in the same first direction, the current can be flowing in the same direction through the first coil portion 1110 and second coil portion 1114, and this can thereby reinforce or increase the magnetic field, and hence, increase (or at least not reduce) the amount of inductance, of the distributed spiral inductor component 1100. The amount of inductance of the distributed spiral inductor component 1100 can range from approximately 6.5 nH to 8.0 nH (e.g., approximately 7.17 nH), for example, although the amount of inductance can be lower than 6.5 nH or greater than 8.0 nH by adjusting (e.g., lowering or increasing) the number of windings of the first coil portion 1110 or second coil portion 1114, if and as desired.

By distributing the first inductor portion 1102 and second inductor portion 1106 of the distributed spiral inductor component 1100, the disclosed subject matter (e.g., a filter component comprising the distributed spiral inductor component 1100) can enable the filter component to be more efficient. As more fully described herein, a metallization layer of a desired conductive material (e.g., superconductive material) can be deposited on the first and second substrate components 1104 and 1108 and selectively removed to facilitate forming the distributed spiral inductor component 1100. The metallization utilized to facilitate forming the distributed spiral inductor component 1100 can be distributed on the first substrate component 1104 and the second substrate component 1108, and the distributed spiral inductor component 1100 can be formed, to reduce a filter footprint of the filter component (e.g., the amount of space utilized by the filter component on the first and second chips) and/or a parasitic effect of the filter component, as compared to other types of inductors. For example, there can be space (e.g., area) savings on the first substrate component 1104, since the first inductor portion 1102 can utilize less space on the first substrate component 1104 than another inductor component would utilize if the other inductor was formed wholly on the first substrate component 1104 and had the same amount of inductance and same total number of windings as the distributed spiral inductor component 1100. Similarly, there can be space savings on the second substrate component 1108, since the second inductor portion 1106 can utilize less space on the second substrate component 1108 than another inductor component would utilize if the other inductor was formed wholly on the second substrate component 1108 and had the same amount of inductance and same total number of windings as the distributed spiral inductor component 1100.

Figure 12:
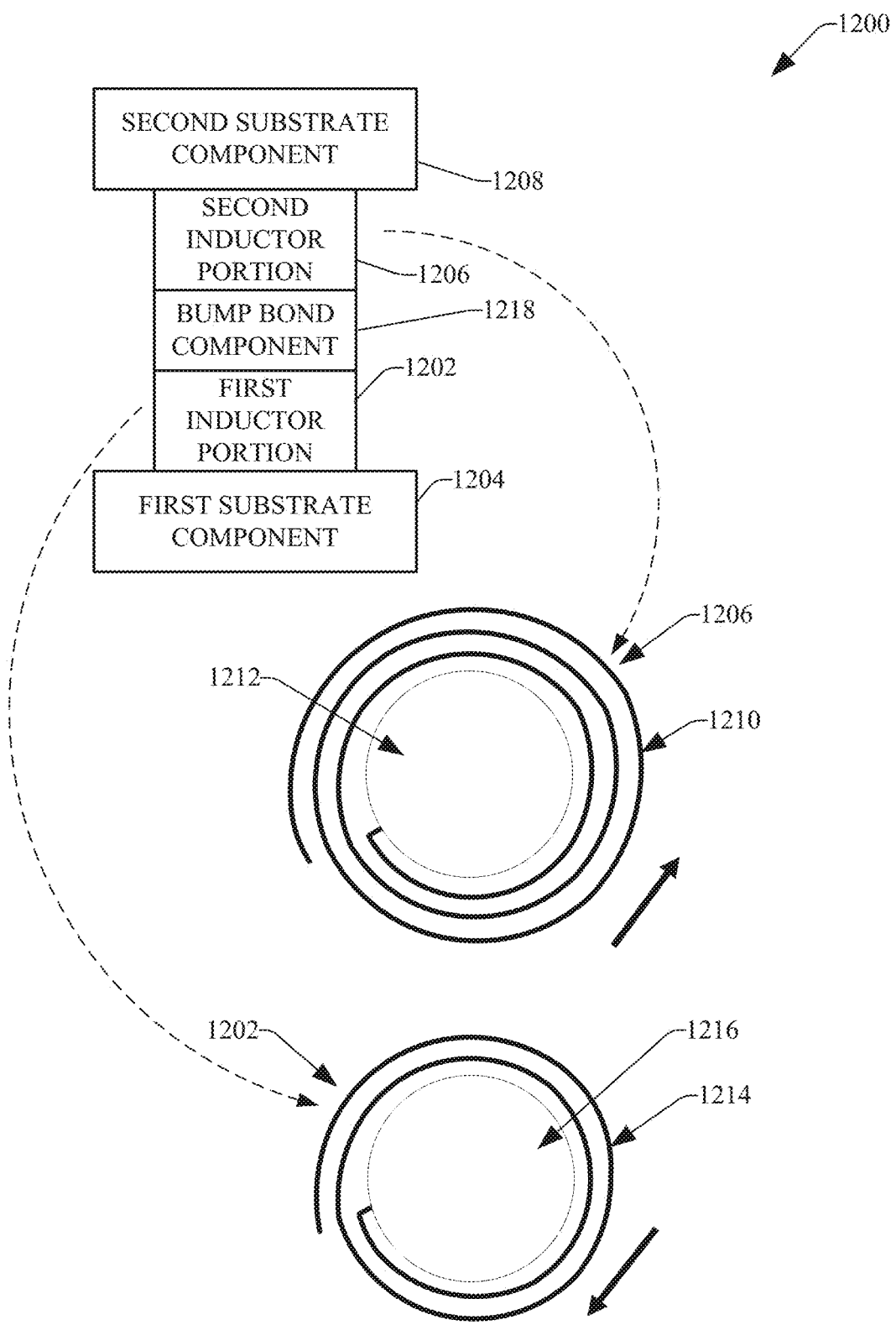
FIG. 12 illustrates a diagram of an example distributed spiral inductor component that can respective winding portions oriented in opposite directions, and can be utilized in a filter component (e.g., low pass filter component), in accordance with various aspects and embodiments of the disclosed subject matter.

FIG. 12 illustrates a diagram of an example distributed spiral inductor component 1200 that can respective winding portions oriented in opposite directions, and can be utilized in a filter component (e.g., low pass filter component), in accordance with various aspects and embodiments of the disclosed subject matter. The distributed spiral inductor component 1200 can comprise a first inductor portion 1202 that can be formed or situated on a first substrate component 1204 of a first chip (e.g., qubit chip), and a second inductor portion 1206 that can be formed or situated on a second substrate component 1208 of a second chip (e.g., interposer chip), wherein the first chip and second chip can be arranged to form a flip-chip package, as more fully described herein.

The first inductor portion 1202 can comprise a first coil portion 1210 and a first pad component 1212 (which can function as a first conductor portion of the first inductor portion 1202). The first coil portion 1210 can comprise one or more windings that can be oriented in a first direction (e.g., clockwise; or alternatively, in a counterclockwise direction). The second inductor portion 1206 can comprise a second coil portion 1214 and a second pad component 1216 (which can function as a second conductor portion of the second inductor portion 1206). The second coil portion 1214 can comprise one or more windings that can be oriented in a second direction (e.g., counterclockwise direction; or alternatively, a clockwise direction), which can be the opposite direction as the windings of the first coil portion 1210.

To facilitate forming the distributed spiral inductor component 1200, the first coil portion 1210 situated on the first substrate component 1204 can be associated with (e.g., connected to) the second coil portion 1214 situated on the second substrate component 1208 via a bump bond component 1218 that can extend from the first substrate component 1204 to the second substrate component 1208. For instance, one end of the bump bond component 1218 can be connected to the inner coil lead of the first coil portion 1210 of the first inductor portion 1202, and the other end of the bump bond component 1218 can be connected to an inner coil lead of the second coil portion 1214 of the second inductor portion 1206.

The amount of inductance that can be generated (e.g., produced) by the distributed spiral inductor component 1200 can be based at least in part on the number of windings of the first coil portion 1210 and the number of windings of the second coil portion 1214, and also the fact that the windings of the first coil portion 1210 and the windings of the second coil portion 1214 are in the opposite directions. By having the windings of the first coil portion 1210 and the windings of the second coil portion 1214 proceed in opposite directions, the current can be flowing in directions through the first coil portion 1210 and second coil portion 1214, and this can thereby reduce (e.g., decrease) the magnetic field, and hence, the amount of inductance, of the distributed spiral inductor component 1200. The amount of inductance of the distributed spiral inductor component 1200 can range from approximately 4.5 nH to 6.0 nH (e.g., approximately 5.12 nH), for example, although the amount of inductance can be lower than 4.5 nH or greater than 6.0 nH by adjusting (e.g., lowering or increasing) the number of windings of the first coil portion 1210 or second coil portion 1214, if and as desired. There can be a number of reasons why it may be desirable to reduce or control the amount of inductance of an inductor (e.g., distributed spiral inductor component 1200) by having the respective windings of the respective inductor portions proceed in opposite directions. For example, if there is a concern regarding magnetic fields being emitted from the inductor component, and it is desired to reduce or minimize the amount of magnetic field being emitted from the inductor component, having the respective windings of the respective inductor portions of the distributed spiral inductor component 1200 proceed in opposite directions can reduce or minimize the amount of magnetic field being emitted by the distributed spiral inductor component 1200.

Similar to the distributed spiral inductor component 1100 of FIG. 11, the distributed spiral inductor component 1200 depicted in FIG. 12 can realize similar enhancements to efficiency of the filter component and/or space savings on the first substrate component 1204 and/or second substrate component 1208.

Figure 13:
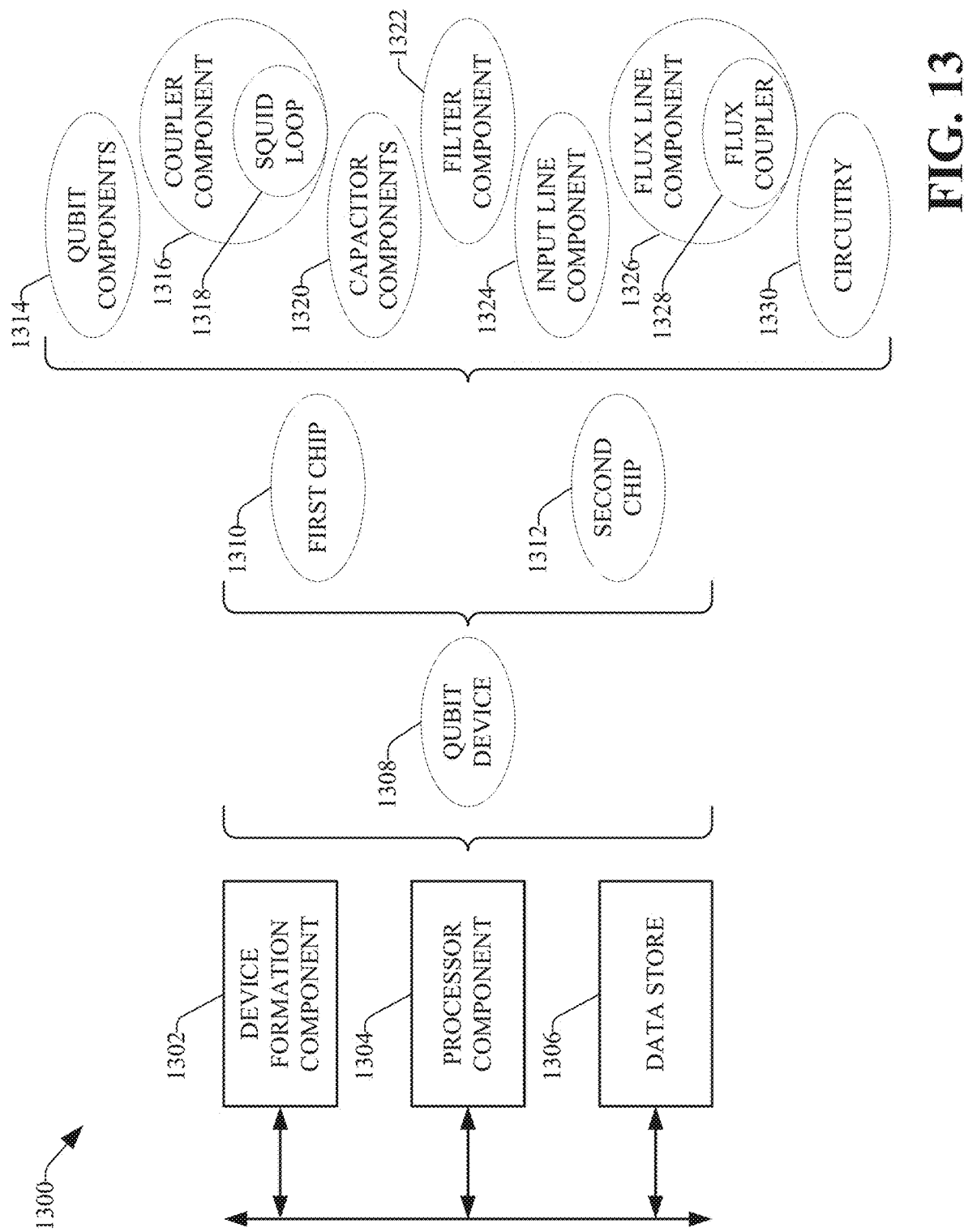
FIG. 13 depicts a block diagram of an example system that can be utilized to create, form, or design a qubit device and/or associated filter component, in accordance with various aspects and embodiments of the disclosed subject matter.

FIG. 13 depicts a block diagram of an example system 1300 that can be utilized to create, form, or design a qubit device and/or associated filter component (e.g., low pass filter component), in accordance with various aspects and embodiments of the disclosed subject matter. The system 1300 can comprise a device formation component 1302, a processor component 1304, and a data store 1306. The device formation component 1302 can be utilized to create, form, or design various components of or associated with a qubit device 1308, such as more fully described herein. For instance, the device formation component 1302 can be utilized to create, form, or design the various components that can be formed or situated on a first chip 1310 (e.g., qubit chip) and various components that can be formed or situated on a second chip 1312 (e.g., interposer chip). The various components can comprise, for example, qubit components 1314, coupler component 1316, which can include SQUID loop 1318, capacitor components 1320, filter component 1322, input line component 1324, flux line component 1326, including flux coupler component (FLUX COUPLER) 1328, and associated circuitry 1330.

As part of and to facilitate creating, forming, or designing the various components of or associated with a qubit device 1308, the device formation component 1302 can form or process substrate components, such as a first substrate component that can be part of the first chip 1310 and a second substrate component that can be part of the second chip 1312. Also, as part of and to facilitate creating, forming, or designing the various components of or associated with a qubit device 1308, the device formation component 1302 also can form, deposit, or process one or more metallization layers on the first and second substrate components, wherein the metallization layers can be formed of one or more desired metal or conductive materials, which can be or include one or more desired superconductive materials (e.g., a niobium-type superconducting material), and wherein a metallization layer can have a desired thickness or height. In some embodiments, the device formation component 1302 can remove (e.g., selectively remove) respective portions of a metallization layer to facilitate creating or forming respective components or circuitry of the qubit device 1308. For example, the device formation component 1302 can employ and/or can control various processes, including microfabrication processes, nanofabrication processes, masking or photoresist processes, photolithography processes, chemical etching processes, other etching or removal processes, or other desired processes to desirably process the metallization layer and remove the respective portions of the metallization layer to facilitate creating or forming the respective components or circuitry of the qubit device 1308.

The processor component 1304 can work in conjunction with the other components (e.g., the device formation component 1302, the data store 1306, or another component) to facilitate performing the various functions of the system 1300. The processor component 1304 can employ one or more processors, microprocessors, or controllers that can process data, such as information relating to, qubit devices, qubit components, coupler components, SQUID loops, capacitor components, inductor components, bump bond components, filter components, input line components, flux line components, flux coupler components, circuit design criteria, circuit design algorithms, traffic flows, policies, protocols, interfaces, tools, and/or other information, to facilitate operation of the system 1300, as more fully disclosed herein, and control data flow between the system 1300 and other components (e.g., computer components, computer, laptop computer, other computing or communication device, or network device) associated with (e.g., connected to) the system 1300.

The data store 1306 can store data structures (e.g., user data, metadata), code structure(s) (e.g., modules, objects, hashes, classes, procedures) or instructions, information relating to qubit devices, qubit components, coupler components, SQUID loops, capacitor components, inductor components, bump bond components, filter components, input line components, flux line components, flux coupler components, circuit design criteria, circuit design algorithms, traffic flows, policies, protocols, interfaces, tools, and/or other information, to facilitate controlling operations associated with the system 1300. In an aspect, the processor component 1304 can be functionally coupled (e.g., through a memory bus) to the data store 1306 in order to store and retrieve information desired to operate and/or confer functionality, at least in part, to the device formation component 1302, the data store 1306, or other component, and/or substantially any other operational aspects of the system 1300.

It should be appreciated that the data store 1306 described herein can comprise volatile memory and/or nonvolatile memory. By way of example and not limitation, nonvolatile memory can include read only memory (ROM), programmable ROM (PROM), electrically programmable ROM (EPROM), electrically erasable ROM (EEPROM), or flash memory. Volatile memory can include random access memory (RAM), which can act as external cache memory. By way of example and not limitation, RAM can be available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Memory of the disclosed aspects are intended to comprise, without being limited to, these and other suitable types of memory.

The systems and/or devices have been (or will be) described herein with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component providing aggregate functionality. The components may also interact with one or more other components not specifically described herein for the sake of brevity, but known by those of skill in the art.

Figure 14:
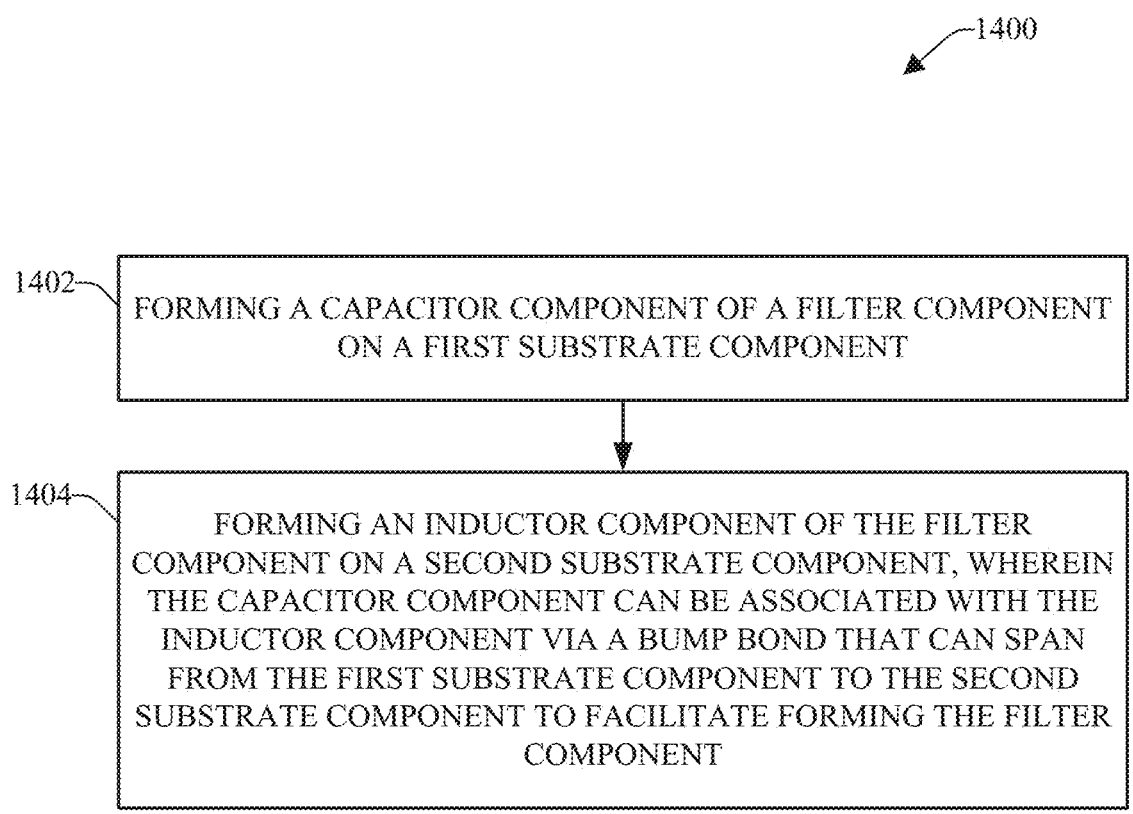
FIG. 14 illustrates a flow diagram of an example, non-limiting method for forming a filter component that can be utilized to provide a desirable filtered signal to a flux line component and reduce Purcell loss of the coupler and qubit devices, in accordance with various aspects and embodiments of the disclosed subject matter.

FIG. 14 illustrates a flow diagram of an example, non-limiting method 1400 for forming a filter component (e.g., a low pass filter component) that can be utilized to provide a desirable (e.g., enhanced, suitable, acceptable, or optimal) filtered signal to a flux line component and reduce Purcell loss of the coupler and qubit devices, in accordance with various aspects and embodiments of the disclosed subject matter. The method 1400 can be performed by, for example, a system (e.g., computer system) comprising or operatively coupled to a device formation component, a processor component, and a memory. Repetitive description of like elements employed in other embodiments described herein is or may be omitted for sake of brevity.

At 1402, a capacitor component of a filter component (e.g., a low pass filter component) can be formed on a first substrate component. The device formation component can situate or form the capacitor component on the first substrate component (e.g., of a qubit chip).

At 1404, an inductor component of the filter component can be formed on a second substrate component, wherein the capacitor component can be associated with the inductor component via a bump bond that can span from the first substrate component to the second substrate component to facilitate forming the filter component. The device formation component can situate or form the inductor component on the second substrate component (e.g., of an interposer chip). The device formation component can associate (e.g., electrically connect) the capacitor component on the first substrate component to the inductor component on the second substrate component via the bump bond that can span (e.g., extend) from the first substrate component (e.g., from a first pad component on the first substrate component) to the second substrate component (e.g., to an inner coil lead of the inductor component on the second substrate component).

Figure 15:
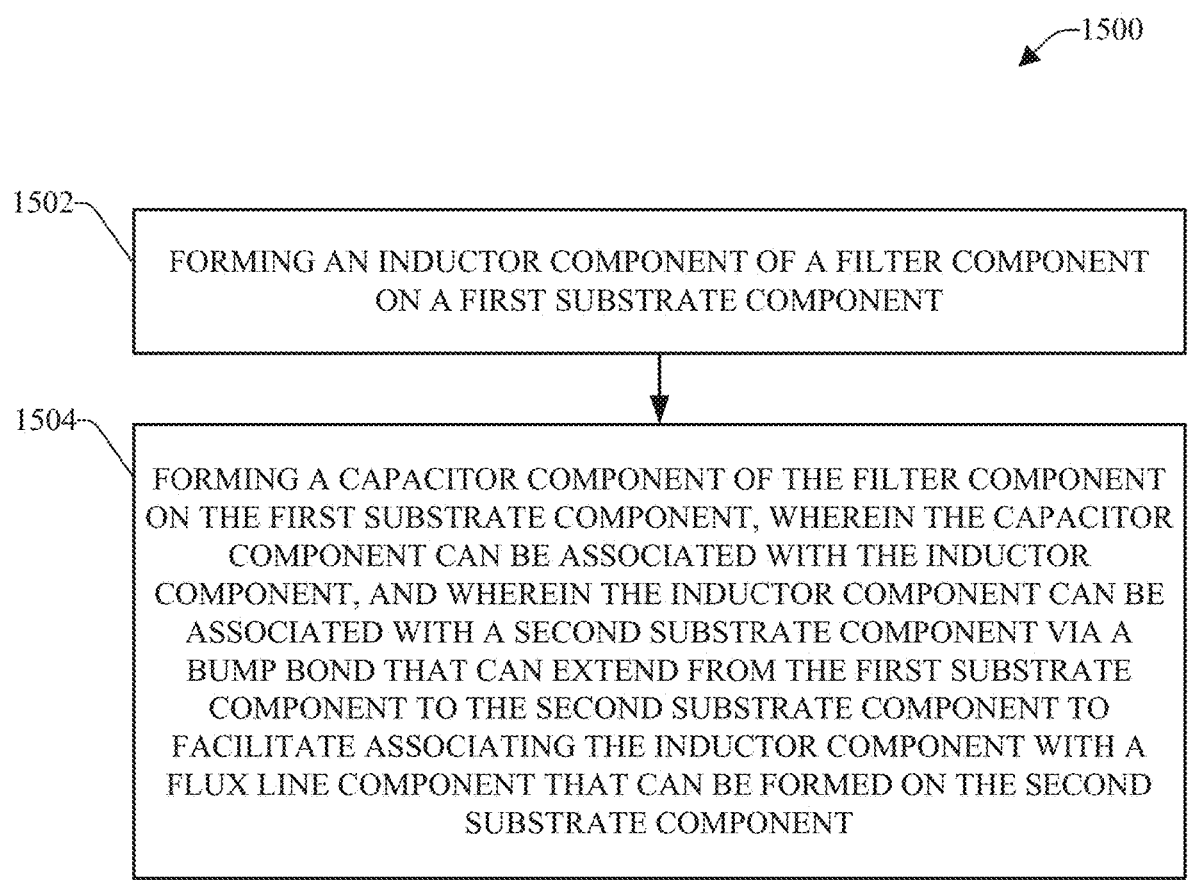
FIG. 15 depicts a flow diagram of another example, non-limiting method for forming a filter component that can be utilized to provide a desirable filtered signal to a flux line component and reduce Purcell loss of the coupler and qubit devices, in accordance with various aspects and embodiments of the disclosed subject matter.

FIG. 15 depicts a flow diagram of another example, non-limiting method 1500 for forming a filter component (e.g., a low pass filter component) that can be utilized to provide a desirable (e.g., enhanced, suitable, acceptable, or optimal) filtered signal to a flux line component and reduce Purcell loss of the coupler and qubit devices, in accordance with various aspects and embodiments of the disclosed subject matter. The method 1500 can be performed by, for example, a system (e.g., computer system) comprising or operatively coupled to a device formation component, a processor component, and a memory. Repetitive description of like elements employed in other embodiments described herein is or may be omitted for sake of brevity.

At 1502, an inductor component of a filter component (e.g., a low pass filter component) can be formed on a first substrate component. The device formation component can situate or form the inductor component on the first substrate component.

At 1504, a capacitor component of the filter component can be formed on the first substrate component and associated with the inductor component, wherein the inductor component can be associated with a second substrate component via a bump bond that can extend from the first substrate component to the second substrate component to facilitate associating the inductor component with a flux line component that can be formed on the second substrate component. The device formation component can situate or form the capacitor component on the first substrate component, and can associate the capacitor component with (e.g., can electrically connect the capacitor component with) the inductor component. The device formation component can associate (e.g., electrically connect) the inductor component with the second substrate component (e.g., a pad component of the second substrate component) via the bump bond that can extend from the first substrate component (e.g., from the inductor component of the first substrate component) to the second substrate component (e.g., to the pad component of the second substrate component) to facilitate associating the inductor component with the flux line component that can be formed on the second substrate component.

Figure 16:
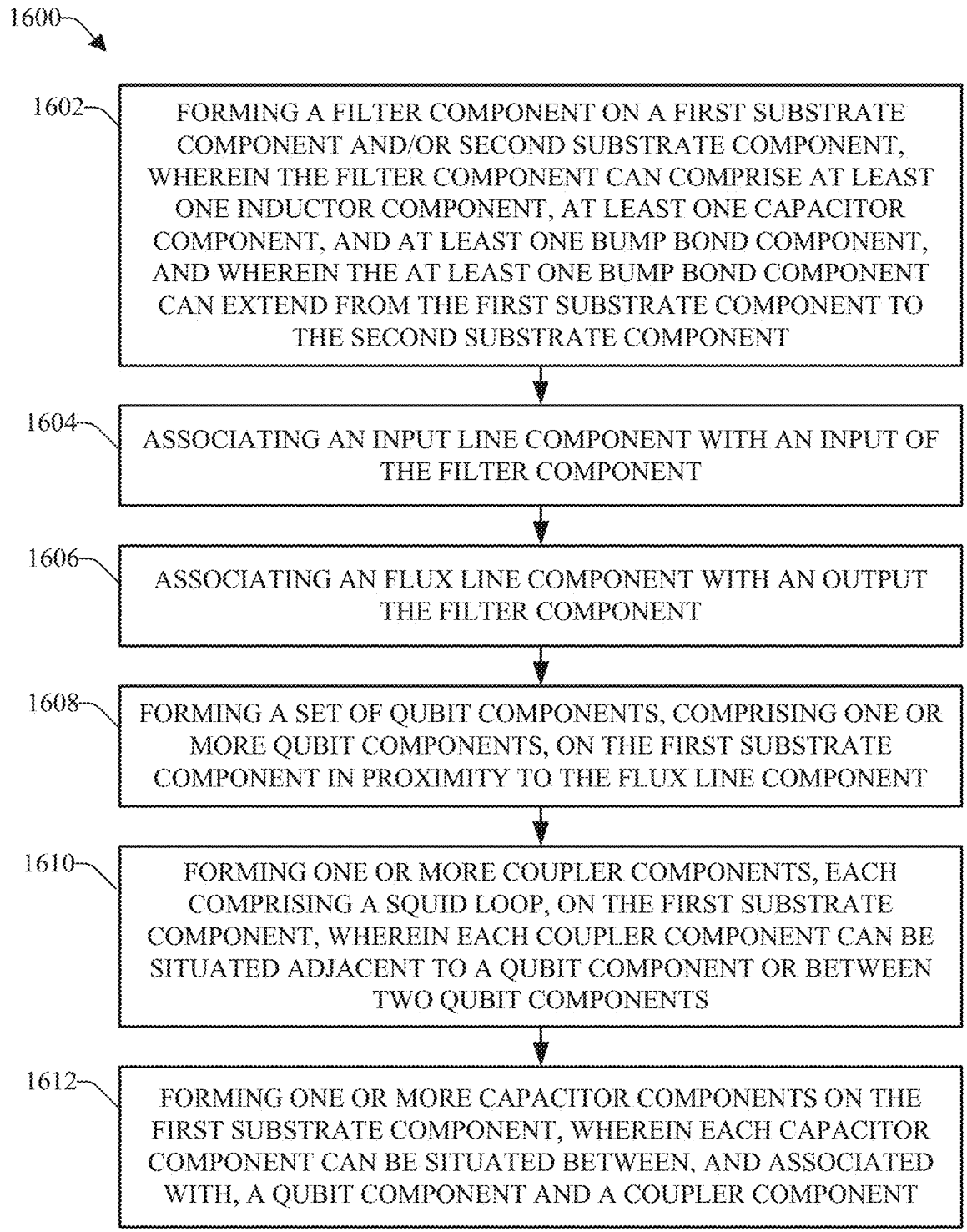
FIG. 16 illustrates a flow diagram of an example, non-limiting method for forming a qubit device that comprises a filter component that can be utilized to provide a desirable filtered signal to a flux line component and reduce Purcell loss of the coupler and qubit devices, in accordance with various aspects and embodiments of the disclosed subject matter.

FIG. 16 illustrates a flow diagram of an example, non-limiting method 1600 for forming a qubit device that comprises a filter component (e.g., a low pass filter component) that can be utilized to provide a desirable (e.g., enhanced, suitable, acceptable, or optimal) filtered signal to a flux line component and reduce Purcell loss of the coupler and qubit devices, in accordance with various aspects and embodiments of the disclosed subject matter. The method 1600 can be performed by, for example, a system (e.g., computer system) comprising or operatively coupled to a device formation component, a processor component, and a memory. Repetitive description of like elements employed in other embodiments described herein is or may be omitted for sake of brevity.

At 1602, a filter component (e.g., a low pass filter component) can be formed on a first substrate component and/or second substrate component, wherein the filter component can comprise at least one inductor component, at least one capacitor component, and at least one bump bond component, and wherein the at least one bump bond component can extend from the first substrate component to the second substrate component. The device formation component can form the filter component on the first substrate component and/or the second substrate component, wherein the filter component can have a desired filter structure, such as more fully described herein. The first substrate component can be part of a qubit chip, and the second substrate component can be part of an interposer chip. The qubit device can comprise the qubit chip and the interposer chip in a flip-chip package, wherein the interposer chip can be flipped (e.g., turned over) to have its top surface (e.g., surface comprising components) face the top surface of the qubit chip.

At 1604, an input line component can be associated with an input of the filter component. The device formation component can form the input line component on the first substrate component or the second substrate component, depending on the desired filter structure being employed. The device formation component can associate (e.g., connect) the input line component with the input (e.g., input port) of the filter component.

At 1606, an flux line component can be associated with an output the filter component. The device formation component can form the flux line component on the second substrate component. The device formation component can associate (e.g., connect) the flux line component to the output (e.g., output port) of the filter component. When an input signal (e.g., electrical signal) is applied to the input line component, the filter component can desirably filter the input signal to produce a filtered signal as an output. The filtered signal can be output from the filter component to the flux line component.

At 1608, a set of qubit components, comprising one or more qubit components, can be formed on the first substrate component in proximity to the flux line component. The device formation component can form the set of qubit components on the first substrate component (e.g., on the qubit chip) in proximity to the flux line component.

At 1610, one or more coupler components, each comprising a SQUID loop, can be formed on the first substrate component, wherein each coupler component can be situated adjacent to a qubit component or between two qubit components. The device formation component can form the one or more coupler components, each comprising the SQUID loop, on the first substrate component, wherein each coupler component can be situated adjacent to a qubit component or in between two qubit components of the set of qubit components.

At 1612, one or more capacitor components can be formed on the first substrate component, wherein each capacitor component can be situated between, and associated with, a qubit component and a coupler component. The device formation component can form the one or more capacitor components on the first substrate component, wherein each capacitor component can be situated between a qubit component and a coupler component to facilitate electrically connecting the qubit component and the coupler component to each other. The filtered signal output from the filter component to the flux line component can cause the flux line component to generate a desirable magnetic field that can be associated with (e.g., applied to) the SQUID loop to facilitate tuning (e.g., adjusting or modifying) the frequency of the qubit device.

For simplicity of explanation, the methods and/or computer-implemented methods are depicted and described as a series of acts. It is to be understood and appreciated that the disclosed subject matter is not limited by the acts illustrated and/or by the order of acts, for example acts can occur in various orders and/or concurrently, and with other acts not presented and described herein. Furthermore, not all illustrated acts can be required to implement the computer-implemented methods in accordance with the disclosed subject matter. In addition, those skilled in the art will understand and appreciate that the computer-implemented methods could alternatively be represented as a series of interrelated states via a state diagram or events. Additionally, it should be further appreciated that the computer-implemented methods disclosed hereinafter and throughout this specification are capable of being stored on an article of manufacture to facilitate transporting and transferring such computer-implemented methods to computers. The term article of manufacture, as used herein, is intended to encompass a computer program accessible from any computer-readable device or storage media.

Figure 17:
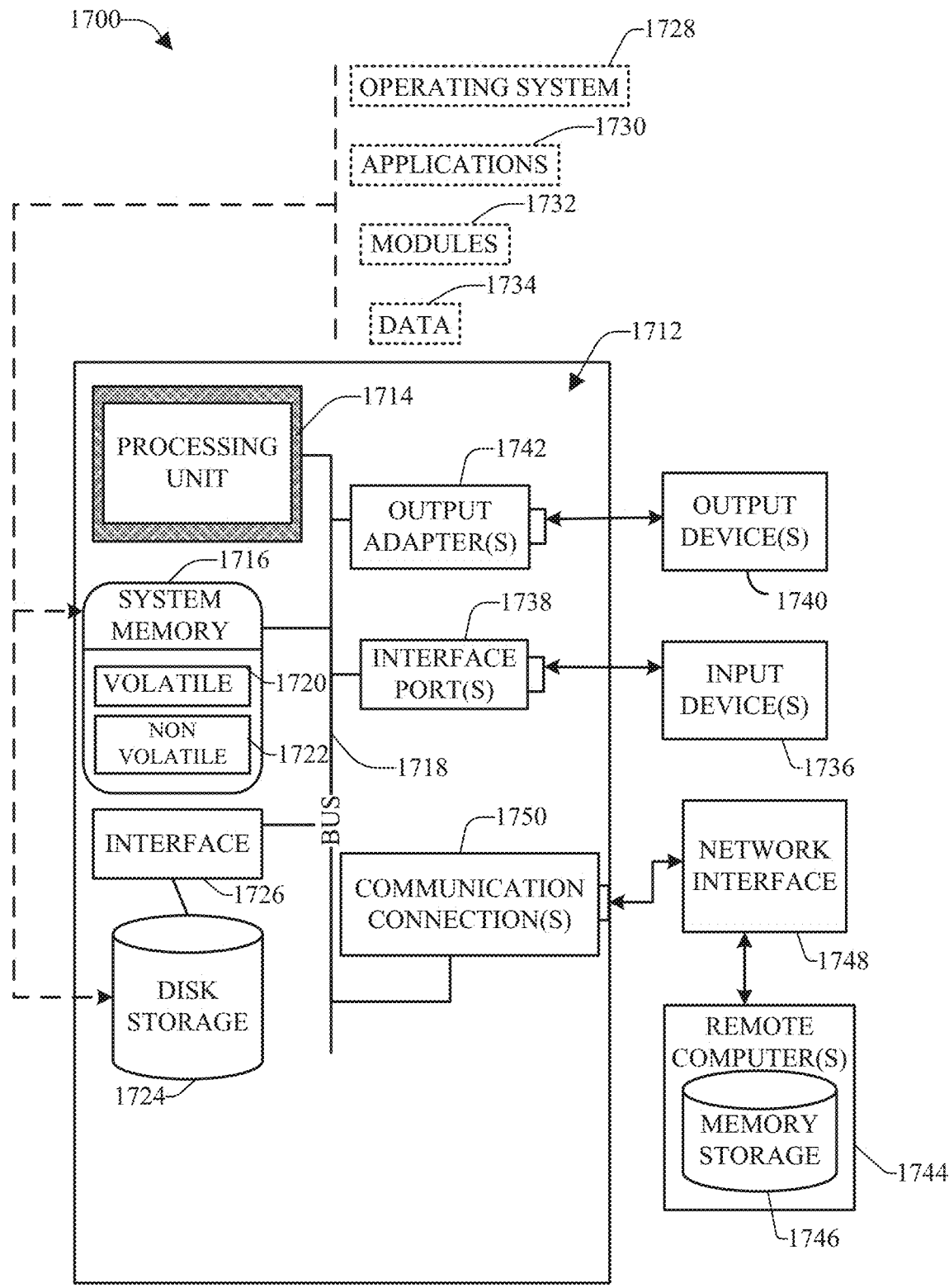
FIG. 17 illustrates a block diagram of an example, non-limiting operating environment in which one or more embodiments described herein can be facilitated.

In order to provide a context for the various aspects of the disclosed subject matter, FIG. 17 as well as the following discussion are intended to provide a general description of a suitable environment in which the various aspects of the disclosed subject matter can be implemented. FIG. 17 illustrates a block diagram of an example, non-limiting operating environment in which one or more embodiments described herein can be facilitated. Repetitive description of like elements employed in other embodiments described herein is or may be omitted for sake of brevity. With reference to FIG. 17, a suitable operating environment 1700 for implementing various aspects of this disclosure can also include a computer 1712. The computer 1712 can also include a processing unit 1714, a system memory 1716, and a system bus 1718. The system bus 1718 couples system components including, but not limited to, the system memory 1716 to the processing unit 1714. The processing unit 1714 can be any of various available processors. Dual microprocessors and other multiprocessor architectures also can be employed as the processing unit 1714. The system bus 1718 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI). The system memory 1716 can also include volatile memory 1720 and nonvolatile memory 1722. The basic input/output system (BIOS), containing the basic routines to transfer information between elements within the computer 1712, such as during start-up, is stored in nonvolatile memory 1722. By way of illustration, and not limitation, nonvolatile memory 1722 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM)). Volatile memory 1720 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM).

Computer 1712 can also include removable/non-removable, volatile/non-volatile computer storage media. FIG. 17 illustrates, for example, a disk storage 1724. Disk storage 1724 can also include, but is not limited to, devices like a magnetic disk drive, floppy disk drive, tape drive, Jaz drive, Zip drive, LS-100 drive, flash memory card, or memory stick. The disk storage 1724 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1724 to the system bus 1718, a removable or non-removable interface is typically used, such as interface 1726. FIG. 17 also depicts software that acts as an intermediary between users and the basic computer resources described in the suitable operating environment 1700. Such software can also include, for example, an operating system 1728. Operating system 1728, which can be stored on disk storage 1724, acts to control and allocate resources of the computer 1712. System applications 1730 take advantage of the management of resources by operating system 1728 through program modules 1732 and program data 1734, e.g., stored either in system memory 1716 or on disk storage 1724. It is to be appreciated that this disclosure can be implemented with various operating systems or combinations of operating systems. A user enters commands or information into the computer 1712 through input device(s) 1736. Input devices 1736 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1714 through the system bus 1718 via interface port(s) 1738. Interface port(s) 1738 include, for example, a serial port, a parallel port, a game port, and a universal serial bus (USB). Output device(s) 1740 use some of the same type of ports as input device(s) 1736. Thus, for example, a USB port can be used to provide input to computer 1712, and to output information from computer 1712 to an output device 1740. Output adapter 1742 is provided to illustrate that there are some output devices 1740 like monitors, speakers, and printers, among other output devices 1740, which require special adapters. The output adapters 1742 include, by way of illustration and not limitation, video and sound cards that provide a method of connection between the output device 1740 and the system bus 1718. It should be noted that other devices and/or systems of devices provide both input and output capabilities such as remote computer(s) 1744.

Computer 1712 can operate in a networked environment using logical connections to one or more remote computers, such as remote computer(s) 1744. The remote computer(s) 1744 can be a computer, a server, a router, a network PC, a workstation, a microprocessor based appliance, a peer device or other common network node and the like, and typically can also include many or all of the elements described relative to computer 1712. For purposes of brevity, only a memory storage device 1746 is illustrated with remote computer(s) 1744. Remote computer(s) 1744 is logically connected to computer 1712 through a network interface 1748 and then physically connected via communication connection 1750. Network interface 1748 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1750 refers to the hardware/software employed to connect the network interface 1748 to the system bus 1718. While communication connection 1750 is shown for illustrative clarity inside computer 1712, it can also be external to computer 1712. The hardware/software for connection to the network interface 1748 can also include, for exemplary purposes only, internal and external technologies such as, modems including regular telephone grade modems, cable modems and DSL modems, ISDN adapters, and Ethernet cards.

One or more embodiments can be a system, a method, an apparatus and/or a computer program product at any possible technical detail level of integration. The computer program product can include a computer readable storage medium (or media) having computer readable program instructions thereon for causing a processor to carry out aspects of the one or more embodiments. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can include the following: a portable computer diskette, a hard disk, a RAM, a ROM, an erasable programmable read-only memory (EPROM or Flash memory), a SRAM, a portable CD-ROM, a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the disclosed subject matter can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the disclosed subject matter.

Aspects of disclosed subject matter are described herein with reference to flowchart illustrations and/or block diagrams of methods, apparatus (systems), and computer program products according to embodiments of the subject disclosure. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create method for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the disclosed subject matter. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can be implemented in combination with other program modules. Generally, program modules include routines, programs, components, data structures, etc. that perform particular tasks and/or implement particular abstract data types. Moreover, those skilled in the art will appreciate that the computer-implemented methods disclosed herein can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other method to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include ROM, PROM, EPROM, EEPROM, flash memory, or nonvolatile RAM (e.g., FeRAM). Volatile memory can include RAM, which can act as external cache memory, for example. By way of illustration and not limitation, RAM is available in many forms such as SRAM, DRAM, SDRAM, DDR SDRAM, ESDRAM, SLDRAM, DRRAM, DRDRAM, and RDRAM. Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
   a low pass filter component that comprises:
      a set of capacitor components and a set of inductor components;
      a first substrate component comprising a capacitor component of the set of capacitor components formed thereon; and
      a second substrate component comprising an inductor component of the set of inductor components formed thereon, wherein the set of inductor components is associated with the set of capacitor components via bump bonds that extend from the first substrate component to the second substrate component and form a ladder network.

2. The system of claim 1, wherein the is a low pass filter component has a defined cutoff frequency that indicates a range of frequencies below the cutoff frequency that are able to pass through the low pass filter component.

3. The system of claim 1, wherein the set of inductor components comprises a spiral inductor components or meandered line inductor components.

4. The system of claim 1, wherein the set of capacitor components comprises a planar capacitor components or parallel plate capacitor components, wherein a first terminal of the capacitor component is connected to the inductor component, and wherein a second terminal of the the capacitor component is connected to a ground component.

5. The system of claim 1, wherein the is a low pass filter component has a cutoff frequency that ranges from approximately 100 megahertz to approximately 10 gigahertz, wherein the low pass filter component is terminated by an inductive load that ranges from approximately 10 picohenries to approximately 500 picohenries, wherein one of the first inductor components of the set of inductor components is a last component of the ladder network and is a series inductor to the inductive load to facilitate not having any capacitor components of the set of capacitor components in parallel with the inductive load.

6. The system of claim 1, further comprising:
a qubit component;
a coupler component associated with the qubit component, wherein the coupler component comprises a superconducting quantum interference device loop;
an input line that provides an input signal to the low pass filter component, wherein the low pass filter component filters the input signal and produces a filtered signal based on the filtering of the input signal; and
a flux line component associated with an output of the low pass filter component, wherein the flux line component receives the filtered signal and is coupled to the qubit component via the superconducting quantum interference device loop of the coupler component through a mutual inductance based on the filtered signal transmitted through the flux line component.

7. The system of claim 6, wherein the qubit component is a flux-tunable qubit component.

8. The system of claim 6, wherein the low pass filter component filters the input signal to reduce an amount of electrical noise in the electrical signal, and wherein the filtered signal, which is provided to the flux line component and associated with the qubit component, has a lower amount of electrical noise than the input signal.

9. The system of claim 6, wherein the low pass filter component is situated between the input line and the flux line component to reduce an amount of first Purcell decay associated with the qubit component, and wherein the low pass filter component inhibits second Purcell decay from capacitive coupling that is able to be produced through the input line that is a dissipative line having a defined impedance.

10. The system of claim 1, wherein the set of inductor components and the set of capacitor components are arranged to form a Gaussian filter structure or a Bessel-Thompson filter structure.

11. The system of claim 1, wherein metallization is utilized to facilitate forming the set of inductor components, the set of capacitor components, the bump bonds, and a ground plane associated with the low pass filter component, and wherein the metallization is superconducting.

12. The system of claim 1, the inductor component is a first inductor component, wherein the set of inductor components comprises a second inductor component, and wherein metallization utilized to facilitate forming the second inductor component is distributed on the first substrate component and the second substrate component to reduce a size or a parasitic effect of the low pass filter component, and wherein first windings of a first portion of the second inductor components are in a same direction as second windings of a second portion of the second inductor components to reinforce a magnetic field generated by a current applied to the low filter component and to not reduce an amount of inductance of the second inductor component.

13. A method, comprising:
forming a low pass filter component, comprising:
forming a set of capacitors and a set of inductors;
forming a capacitor of the set of capacitors on a first substrate;
forming an inductor of the set of inductors on a second substrate and;
connecting the set of capacitors and the set of inductors via bump bonds that span from the first substrate to the second substrate and form a ladder network.

14. The method of claim 13, wherein the low pass filter has a defined cutoff frequency that indicates a range of frequencies below the cutoff frequency that are able to pass through the low pass filter.

15. The method of claim 13, further comprising:
forming a qubit component on the first substrate;
forming a coupler device associated with the qubit component, wherein the coupler device comprises a superconducting quantum interference device loop;
forming an input line that provides an input signal to the low pass filter, wherein the low pass filter filters the input signal and produces a filtered signal based on the filtering of the input signal; and
forming a flux line associated with an output of the low pass filter, wherein the flux line receives the filtered signal and is coupled to the qubit component via the superconducting quantum interference device loop of the coupler device through a mutual inductance based on the filtered signal transmitted through the flux line.

16. The method of claim 13, wherein the set of inductors comprise spiral inductors or a meandered line inductors, wherein the set of capacitors comprise planar capacitors or a parallel plate capacitors, wherein a first terminal of the capacitor is connected to the inductor, and wherein a second terminal of the capacitor is connected to a ground.

17. A system, comprising:
a low pass filter component that comprises:
a set of capacitor components and a set of inductor components;
a capacitor component of the set of capacitor components formed on a first substrate component; and
an inductor component of the set of inductor components formed on a second substrate component, wherein the set of inductor components is connected to the set of capacitor components via bump bonds that extend from the first substrate component to the second substrate component and form a ladder network to facilitate associating the inductor component with a flux line component that is formed on the second substrate component.

18. The system of claim 17, wherein the low pass filter component that has a defined cutoff frequency that indicates a range of frequencies below the cutoff frequency that are able to pass through the low pass filter component, wherein the set of inductor components comprises a spiral inductor components or a meandered line inductor components, wherein the set of capacitor components comprises planar capacitor components or a parallel plate capacitor components, and wherein a terminal of the capacitor component is connected to a ground component.

19. The system of claim 17, further comprising:
a qubit component;
a coupler component associated with the qubit component, wherein the coupler component comprises a superconducting quantum interference device loop; and
an input line that provides an input signal to the low pass filter component, wherein the low pass filter component filters the input signal and produces a filtered signal based on the filtering of the input signal, wherein the flux line component is associated with an output of the low pass filter component, and wherein the flux line component receives the filtered signal and is coupled to the qubit component via the superconducting quantum interference device loop of the coupler component through a mutual inductance based on the filtered signal transmitted through the flux line component.

20. The system of claim 17, wherein the low pass filter component has a cutoff frequency that ranges from approximately 100 megahertz to approximately 10 gigahertz.

\* \* \* \* \*